United States Patent
Ullah et al.

(10) Patent No.: US 10,844,165 B2
(45) Date of Patent: Nov. 24, 2020

(54) COPOLYMER, A METHOD OF SYNTHESIZING THEREOF, AND A METHOD FOR PRODUCING HYDROGEN GAS

(71) Applicant: KING FAHD UNIVERSITY OF PETROLEUM AND MINERALS, Dhahran (SA)

(72) Inventors: Nisar Ullah, Dhahran (SA); Muhammad Mansha, Dhahran (SA); Ibrahim Khan, Dhahran (SA); Ahsanulhaq Qurashi, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 15/910,236

(22) Filed: Mar. 2, 2018

(65) Prior Publication Data
US 2019/0270845 A1    Sep. 5, 2019

(51) Int. Cl.
| | | |
|---|---|---|
| C08G 61/12 | (2006.01) | |
| C25B 11/04 | (2006.01) | |
| C25B 1/06 | (2006.01) | |
| C25B 1/00 | (2006.01) | |
| C08F 2/00 | (2006.01) | |

(52) U.S. Cl.
CPC ........... C08G 61/124 (2013.01); C25B 1/003 (2013.01); C25B 1/06 (2013.01); C25B 11/0405 (2013.01); C25B 11/0447 (2013.01)

(58) Field of Classification Search
CPC .................................................. C08G 61/124
USPC ....................................................... 528/422
See application file for complete search history.

(56) References Cited

U.S. PATENT DOCUMENTS

| | | | |
|---|---|---|---|
| 9,455,059 B2* | 9/2016 | Blouin | C08G 61/124 |
| 2014/0239157 A1* | 8/2014 | Burgess | H01J 31/26 |
| | | | 250/208.1 |

FOREIGN PATENT DOCUMENTS

| | | |
|---|---|---|
| CN | 107132207 A | 9/2017 |
| CN | 107200832 A | 9/2017 |

OTHER PUBLICATIONS

Mansha et al; "Synthesis—carbazole containing conjugated polymers", Elsevier Ltd; Journal; 42(16), 10952-10961; Chem Abstract 166:551090. (Year: 2017).*
Dr. Xiujuan Xu, et al., "Covalent Functionalization of Graphene by Nucleophilic Addition Reaction: Synthesis and Optical-Limiting Properties", Chemistry—An Asian Journal, vol. 12, Issue 19, Oct. 5, 2017, 3 pages (Abstract Only).
Peiying Li, et al., "Soluble graphene composite with aggregation-induced emission feature: non-covalent functionalization and application in explosive detection", Journal of Materials Chemistry C, vol. 5, Issue 25, (2017), 2 pages (Abstract Only).
(Continued)

*Primary Examiner* — Duc Truong
(74) *Attorney, Agent, or Firm* — Oblon, McClelland, Maier & Neustadt, L.L.P.

(57) ABSTRACT

A copolymer containing carbazole-based and vinylene based moieties, a photoelectrode comprising a metal oxide substrate and the copolymer as a photoelectrocatalyst component to the photoelectrode, as well as a photoelectrochemical cell including the photoelectrode. Methods of producing the copolymers, and methods of using the photoelectrochemical cell to produce hydrogen gas are also provided.

20 Claims, 14 Drawing Sheets

(56) References Cited

OTHER PUBLICATIONS

Muhammad Mansha, et al., "Synthesis, characterization and visible-light-driven photoelectrochemical hydrogen evolution reaction of carbazole-containing conjugated polymers", International Journal of Hydrogen Energy, vol. 42, Issue 16, Apr. 20, 2017, 3 pages (Abstract Only).

Wenbo Wu, et al., "A conjugated hyperbranced polymer constructed from carbazole and tetraphenylethylene moieties: convenient synthesis through one-pot "A2+B4" Suzuki polymerization, aggregation-induced enhanced emission, and application as explosive chemosensors and PLEDs", Journal of Materials Chemistry, vol. 22, Issue 13, (2012), 2 pages (Abstract Only).

Zhong-an Li, et al., "Solution-processable π-conjugated dendrimers with hole-transporting, electroluminescent and fluorescent pattern properties", Journal of Materials Chemistry, vol. 21. Issue 38, (2011), 1 page (Abstract Only).

\* cited by examiner

R = 2-EtHexyl (4)

R' = Dodecyl (5)

R' = 2-EtHex (6)

COPOLYMER, A METHOD OF SYNTHESIZING THEREOF, AND A METHOD FOR PRODUCING HYDROGEN GAS

STATEMENT OF FUNDING ACKNOWLEDGEMENT

This project was funded by King Fahd University of Petroleum and Minerals (KFUPM) under project number NUS 15103/4.

STATEMENT REGARDING PRIOR DISCLOSURE BY THE INVENTORS

Aspects of this technology are described in an article "Synthesis, characterization and visible-light-driven photoelectrochemical hydrogen evolution reaction of carbazole-containing conjugated polymers" published in International Journal of Hydrogen Energy, 2017, 42(16), 10952-10961, on Mar. 3, 2017, which is incorporated herein by reference in its entirety.

BACKGROUND OF THE INVENTION

Technical Field

The present disclosure relates to a copolymer and methods of its synthesis. Additionally, the present disclosure relates to a photoelectrode containing the copolymer and a method of using the photoelectrode as part of a photoelectrochemical cell for producing hydrogen gas.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

The world's economic reliance on fossil fuel-based technology induces anthropogenic climate change. On the other hand, the intermittent nature of wind, solar and geothermal sustainable energy technologies limits their efficiency of energy delivery, making them unideal for some common applications [Gray H B. Powering the planet with solar fuel. Nat Chem 2009; 1:7-7; and Lewis N S, Nocera D G. Powering the planet: chemical challenges in solar energy utilization. Proc Natl Acad Sci USA 2006; 103:15729-35]. As a clean burning fuel generating only $H_2O$ after consumption, $H_2$ is one of the most important fuel candidates with relatively high abundance [Li X, Ci S, Jia J, Wen Z. Graphene Loading Molybdenum Carbide/Oxide Hybrids as Advanced Electrocatalysts for hydrogen evolution reaction. Int J Hydrogen Energy 2016; 41:13005-13; and Chen Z, Qin M, Chen P, Jia B, He Q, Qu X. Tungsten carbide/carbon composite synthesized by combustion-carbothermal reduction method as electrocatalyst for hydrogen evolution reaction. Int J Hydrogen Energy 2016; 41:13005-13]. Production of $H_2$ from water splitting using solar light and semiconductor photoelectrodes is an important technology because it operates at a lower electrolysis voltage of water compared to the theoretical electrolysis value at 1.23 V and provides $H_2$ of high purity [Liang Y, Li Y, Wang H, Dai H. Strongly Coupled Inorganic/Nanocarbon Hybrid Materials for Advanced Electrocatalysis. J Am Chem Soc 2013; 135: 2013-36; Wang H, Dai H. Strongly coupled inorganic-nanocarbon hybrid materials for energy storage. Chem Soc Rev 2013; 42:3088; Iqbal N, Khan I, Yamani Z H, Qurashi A. Sonochemical Assisted Solvothermal Synthesis of Gallium Oxynitride Nanosheets and their Solar-Driven Photoelectrochemical Water-Splitting Applications. Sci Rep 2016; 6:32319; and Zeng K, Zhang D. Recent progress in alkaline water electrolysis for hydrogen production and applications. Prog Energy Combust Sci 2010; 36:307-26, each incorporated herein by reference in their entirety]. Over the past decades, substantial efforts have been devoted to developing photocatalytic systems [Johnson T C, Morris D J, Wills M. Hydrogen generation from formic acid and alcohols using homogeneous catalysts. Chem Soc Rev 2010; 39:81-8, incorporated herein by reference in its entirety] which contain semiconducting materials such as inorganic metal oxides, (oxy) sulfides, (oxy) nitrides, and molecular catalysts such as iron hydrogenase enzymes and ruthenium(II)-tris-bipyridine. However, use of co-catalysts that optimize light harvesting, improve charge separation and surface catalytic kinetics are usually required to obtain a photocatalyst with a higher photocatalytic activity [Li Q, Guo B, Yu J, Ran J, Zhang B, Yan H, et al. Highly Efficient Visible-Light-Driven Photocatalytic Hydrogen Production of CdS-Cluster-Decorated Graphene Nanosheets. J Am Chem Soc 2011; 133:10878-84, incorporated herein by reference in its entirety]. These photocatalytic systems with co-catalysts suffer from limited access to rare and expensive noble metal based co-catalysts, rigidity in structure and property, and unsatisfactory $H_2$ production efficiency [Zhang Z, Long J, Yang L, Chen W, Dai W, Fu X, et al. Organic semiconductor for artificial photosynthesis: water splitting into hydrogen by a bioinspired $C_3N_3S_3$ polymer under visible light irradiation. Chem Sci 2011; 2:1826-30, incorporated herein by reference in its entirety].

Conjugated polymers having delocalized π electrons have been utilized in developing photovoltaic devices and solar cells [Zhang G, Lami V, Rominger F, Vaynzof Y, Mastalerz M. Rigid Conjugated Twisted Truxene Dimers and Trimers as Electron Acceptors. Angew Chemie Int Ed 2016; 55:3977-81, incorporated herein by reference in its entirety]. The discovery of poly(p-phenylene)s as a photocatalyst for $H_2$ evolution in 1985 [Yanagida S, Kabumoto A, Mizumoto K, Pac C, Yoshino K. Poly(p-phenylene)-catalysed photoreduction of water to hydrogen. J Chem Soc Chem Commun 1985:474, incorporated herein by reference in its entirety] spurred a substantial amount of research on design and synthesizing new conjugated photocatalysts. As a result, conjugated microporous network polymers (CMPs) [Sprick R S, Bonillo B, Clowes R, Guiglion P, Brownbill N J, Slater B J, et al. Visible-Light-Driven Hydrogen Evolution Using Planarized Conjugated Polymer Photocatalysts. Angew Chemie Int Ed 2016; 55:1792-6, incorporated herein by reference in its entirety], polymeric carbon nitride based materials [Wang X, Maeda K, Thomas A, Takanabe K, Xin G, Carlsson J M, et al. A metal-free polymeric photocatalyst for hydrogen production from water under visible light. Nat Mater 2009; 8:76-80, incorporated herein by reference in its entirety] and organic dye based perylene diimides and porphyrins were developed for solar water splitting. The performance of some organic photocatalysts for photocatalytic $H_2$ evolution is comparable to inorganic photocatalysts. For instance, CMPs having tunable optical band gaps ranging from 1.94 to 2.95 eV have enhanced visible light absorption. In the presence of diethylamine as a sacrificial agent, CP-CMP10 generated $H_2$ at a rate of 17.4 µmol $h^{-1}$ [Sprick R S, Jiang J-X, Bonillo B, Ren S, Ratvijitvech T, Guiglion P, et al. Tunable Organic Photocatalysts for Visible-Light-Driven Hydrogen Evolution. J Am Chem Soc 2015; 137:3265-70, incorporated herein by reference in its entirety]. Recently, planarized fluorene-type conjugated polymers for photocatalytic $H_2$ evolution were reported. The $H_2$ production performance of an optimal P7 polymer reached to 92 µmol $h^{-1}$, which further increased to 116 µmol $h^{-1}$ upon deposition of Pt as a co-catalyst [Pan C, Takata T, Nakabayashi M, Matsumoto T, Shibata N, Ikuhara Y, et al. A Complex Perovskite-Type Oxynitride: The First Photocatalyst for Water Splitting Operable at up to 600 nm. Angew Chemie Int Ed 2015; 54:2955-9; and Zhang J, Wang X. Solar Water Splitting at λ=600 nm: A Step Closer to Sustainable Hydrogen Production. Angew Chemie Int Ed 2015; 54:7230-2, each incorporated herein by reference in their entirety]. In another report, crystalline polyimide (PI) photocatalyst for $H_2$ evolution under visible light irradiation was developed. The optical band gap of PI could be tuned from 3.39 eV to 2.56 eV by changing the reaction temperature of polymerization from 250 to 350° C. [Chu S, Wang Y, Wang C, Yang J, Zou Z. Bandgap modulation of polyimide photocatalyst for optimum $H_2$ production activity under visible light irradiation. Int J Hydrogen Energy 2013; 38:10768-72, incorporated herein by reference in its entirety].

A systematic adjustment of structure and property at molecular level is difficult for inorganic crystalline solids. However, organic photocatalysts can be produced over a wide range of compositions, which allows their accessibility and a systematic control over their physical and chemical properties, e.g. band gaps [Liu G, Wang T, Zhang H, Meng X, Hao D, Chang K, et al. Nature-Inspired Environmental "Phosphorylation" Boosts Photocatalytic $H_2$ Production over Carbon Nitride Nanosheets under Visible-Light Irradiation. Angew Chemie Int Ed 2015; 54:13561-5; and Han Q, Wang B, Zhao Y, Hu C, Qu L. A Graphitic-$C_3N_4$ "Seaweed" Architecture for Enhanced Hydrogen Evolution. Angew Chemie Int Ed 2015; 54:11433-7, each incorporated herein by reference in their entirety]. Furthermore, the ease of depositing organic semiconductors to low-cost substrates through high-throughput solution process [Zheng Y, Lin L, Wang B, Wang X. Graphitic Carbon Nitride Polymers toward Sustainable Photoredox Catalysis. Angew Chemie Int Ed 2015; 54:12868-84, incorporated herein by reference in its entirety] is advantageous. In addition, high absorption coefficient of the organic photocatalyst makes it an ideal substance to absorb photons efficiently [Schwinghammer K, Mesch M B, Duppel V, Ziegler C, Senker J, Lotsch B V. Crystalline Carbon Nitride Nanosheets for Improved Visible-Light Hydrogen Evolution. J Am Chem Soc 2014; 136:1730-3; and Li G, Zhu R, Yang Y. Polymer solar cells. Nat Photonics 2012; 6:153-61, each incorporated herein by reference in their entirety]. Ng et al. has utilized a polybithiophene (PBTh) film as photoelectrocatalytic electrode. Upon illumination of visible light, the PBTh film generated an onset potential of −0.03 V vs SCE for the hydrogen evolution reaction (HER). However, long-term stability and catalytic activity of PBTh was unsatisfactory [Ng C H, Winther-Jensen O, Kolodziejczyk B, Ohlin C A, Winther-Jensen B. Photo-electrocatalytic $H_2$ evolution on poly(2,2'-bithiophene) at neutral pH. Int J Hydrogen Energy, 2014; 39:18230-4, incorporated herein by reference in its entirety]. Based on earlier studies, organic conjugated semiconductors could potentially function as visible light photocatalysts for solar to chemical conversion. Limitations of these photocatalytic systems include the harsh condition of photoelectrocatalytic (PEC) water oxidation reaction and aggregation of organic dye based materials resulting in problematic solution-processing. A economically competitive PEC $H_2$ production requires the development of robust semiconducting materials in a cost-effective fashion. It is essential that the polymeric photocatalyst has a narrow band gap, which helps generating sufficient charge carriers for proton reduction and sacrificial oxidation, and subsequently lead to improved $H_2$ evolution by improved light harvesting ability [Janssen R A J, Nelson J. Factors Limiting Device Efficiency in Organic Photovoltaics. Adv Mater 2013; 25:1847-58; and Groves C, Reid O G, Ginger D S. Heterogeneity in Polymer Solar Cells: Local Morphology and Performance in Organic Photovoltaics Studied with Scanning Probe Microscopy. Acc Chem Res 2010; 43:612-20, each incorporated herein by reference in their entirety]. In addition, an extended conjugation length would improve the migration of exciton/polaron along the polymer chain. Finally, a suitable photocatalyst should have a band edge located at the redox window of water splitting potentials in order to be stable towards water corrosion [Gao J, Chen W, Dou L, Chen C-C, Chang W-H, Liu Y, et al. Elucidating Double Aggregation Mechanisms in the Morphology Optimization of Diketopyrrolopyrrole-Based Narrow Bandgap Polymer Solar Cells. Adv Mater 2014; 26:3142-7, incorporated herein by reference in its entirety].

In an earlier study, linear conjugated phenylenes fused with methylene bridges or other bridging functionalities with increased planarity and/or degree of conjugation have demonstrated improved $H_2$ evolution compared to their unfused counterparts. The kinetics of $H_2$ evolution was enhanced by deposition of co-catalysts such as Pt or Ru. Moreover, $H_2$ evolution activity could be increased by using a sacrificial electron donor such as triethanolamine, methanol, and ethanol or mixtures thereof. From a sustainable development viewpoint, use of noble metals as co-catalysts for water splitting would increase the overall cost of a catalyst system, and is not viable for large scale productions.

In view of the forgoing, one objective of the present disclosure is to provide a copolymer capable of photoelectrocatalysis. The copolymer may be deposited on a substrate and used as a photoelectrode in a photoelectrochemical cell for hydrogen gas generation.

BRIEF SUMMARY OF THE INVENTION

According to a first aspect, the present disclosure relates to a copolymer of formula (I)

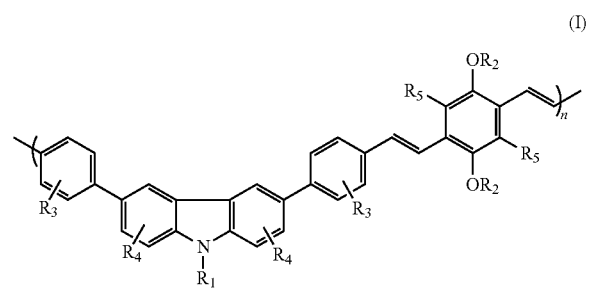

(I)

or a salt thereof, a solvate thereof, a tautomer thereof, a stereoisomer thereof, or a mixture thereof wherein (i) $R_1$ is selected from the group consisting of a hydrogen, an optionally substituted alkyl, an optionally substituted cycloalkyl, an optionally substituted arylalkyl, an optionally substituted aryl, an optionally substituted alkanoyl, and an optionally substituted aroyl, (ii) each $R_2$ is independently selected from the group consisting of an optionally substituted alkyl, an optionally substituted cycloalkyl, an optionally substituted aryl, and an optionally substituted arylalkyl, (iii) each $R_3$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, (iv) each $R_4$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, and an optionally substituted aroyl, (v) each $R_5$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, and (vi) n is a positive integer in a range of 2-10,000.

In one embodiment, each $R_3$, $R_4$ and $R_5$ are a hydrogen, $R_1$ is a hydrogen or an optionally substituted alkyl, and each $R_2$ is independently an optionally substituted alkyl.

In one embodiment, $R_1$ is 2-ethylhexyl, and each $R_2$ is independently 2-ethylhexyl or dodecyl.

In one embodiment, the copolymer has a formula selected from the group consisting of

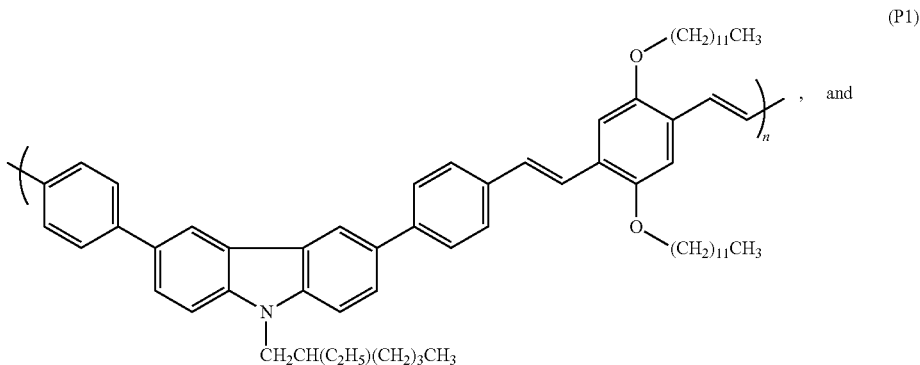

(P1)

, and

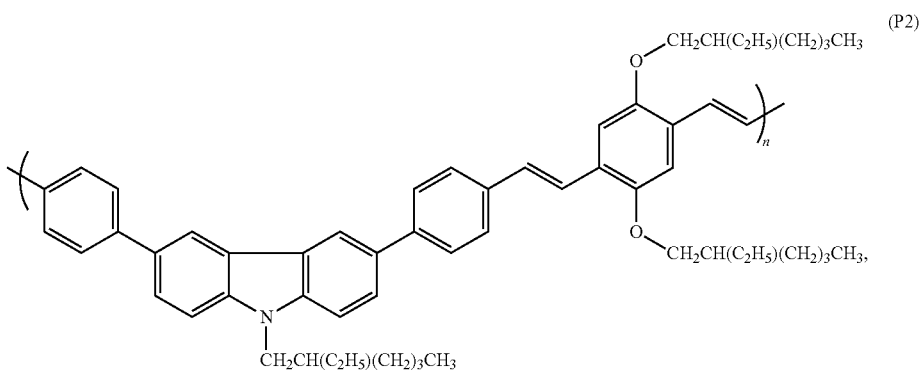

(P2)

wherein n is a positive integer in the range of 2-10000 for each of formulae (P1) and (P2).

In one embodiment, the copolymer is in the form of microspheres having a diameter of 1-10 μm.

In one embodiment, the copolymer has a band gap energy of 2.0-2.8 eV.

In one embodiment, the copolymer has a fluorescence emission peak of 520-570 nm upon excitation at a wavelength of 380-400 nm.

According to a second aspect, the present disclosure relates to a method of producing the copolymer of the first aspect, the method involving reacting a dialdehyde of formula (II)

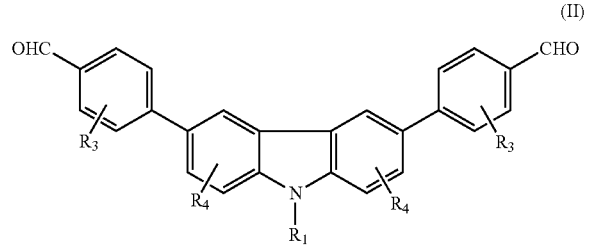

(II)

or a salt, solvate, tautomer or stereoisomer thereof, with a diphosphonate of formula (III)

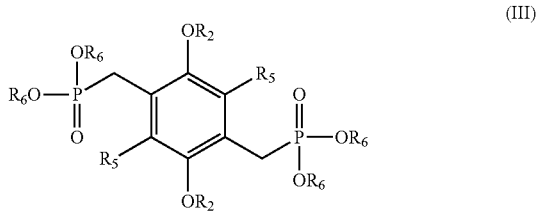

(III)

or a salt, solvate, tautomer or stereoisomer thereof in the presence of a base to form the copolymer, wherein (i) $R_1$ is selected from the group consisting of a hydrogen, an optionally substituted alkyl, an optionally substituted cycloalkyl, an optionally substituted arylalkyl, an optionally substituted aryl, an optionally substituted alkanoyl, and an optionally substituted aroyl, (ii) each $R_2$ is independently selected from the group consisting of an optionally substituted alkyl, an optionally substituted cycloalkyl, an optionally substituted aryl, and an optionally substituted arylalkyl, (iii) each $R_3$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, (iv) each $R_4$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, and an optionally substituted aroyl, (v) each $R_5$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, and (vi) each $R_6$ is an optionally substituted alkyl or an optionally substituted arylalkyl.

In one embodiment, a molar ratio of the dialdehyde of formula (II) to the diphosphonate of formula (III) is in a range of 1:2 to 2:1.

According to a third aspect, the present disclosure relates to a photoelectrode, comprising a metal oxide conducting substrate, and a layer comprising the copolymer of formula (I) of claim 1 deposited over the metal oxide conducting substrate. Additionally, the layer has a thickness in a range of 5-500 nm.

In one embodiment, the photoelectrode has an ultraviolet visible absorption with an absorption edge of 500-660 nm.

In one embodiment, the metal oxide conducting substrate is fluorine doped tin oxide.

According to a forth aspect, the present disclosure relates to a photoelectrochemical cell, comprising the photoelectrode of the third aspect, a counter electrode, and an electrolyte solution comprising water and an inorganic salt in contact with both electrodes.

In one embodiment, the electrolyte solution has an inorganic salt concentration of 0.05-1 M.

In one embodiment, the electrolyte solution has a pH in a range of 5-9.

In one embodiment, the photoelectrode has a photo-current density in a range from −1.0 to −100 μA/cm² when the electrodes are subjected to a potential of −0.25 to 0.05 V under visible light irradiation.

In one embodiment, the photoelectrode has a photo-current density in a range from −0.25 to −2.5 mA/cm² when the electrodes are subjected to a potential of −0.5 to −2.0 V under visible light irradiation.

In one embodiment, the photoelectrochemical cell further comprises a reference electrode in contact with the electrolyte solution.

In one embodiment, the photo-current density decreases by less than 35% after subjecting the photoelectrode to a potential of −0.25 to 0.05 V under visible light irradiation for 1-9 hours.

According to a fifth aspect, the present disclosure relates to a method of forming hydrogen gas, the method involving subjecting the electrodes of the photoelectrochemical cell of the forth aspect to a potential of −2.0 to 0.05 V, and concurrently irradiating the photoelectrochemical cell with visible light, thereby forming hydrogen gas.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
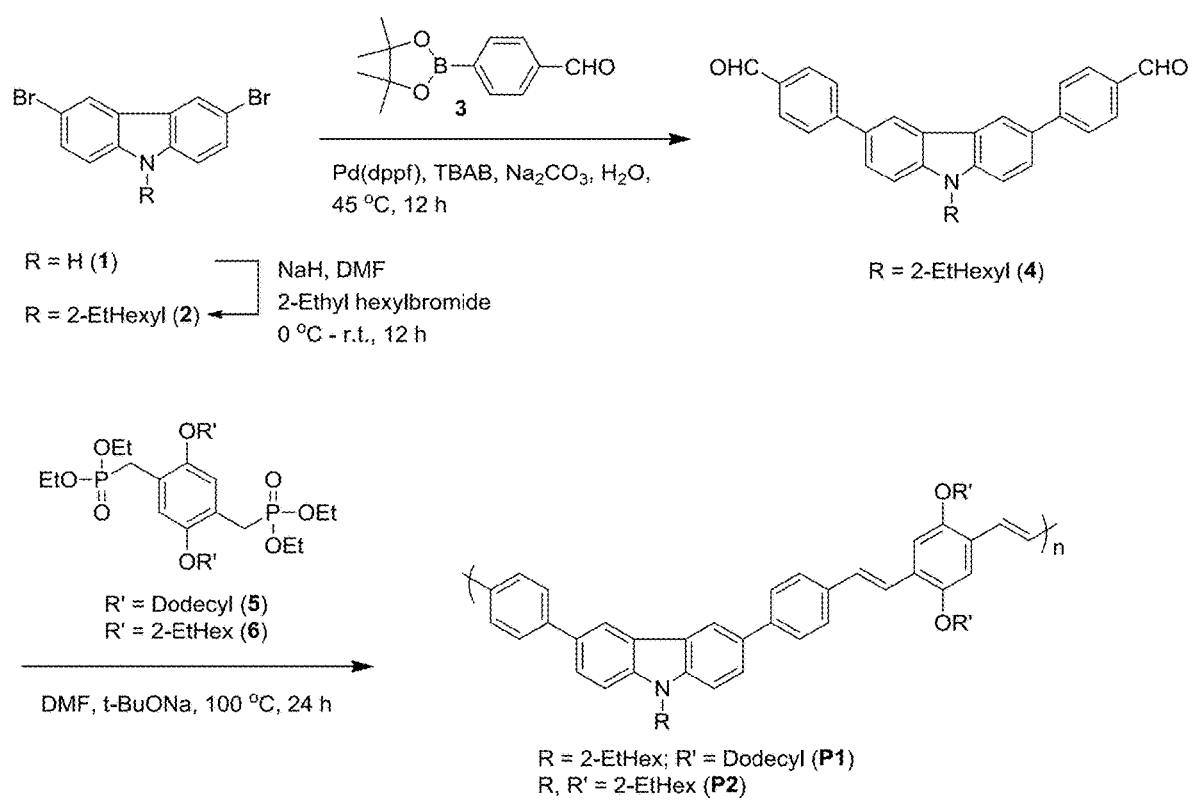
FIG. 1 is a synthetic scheme for copolymers of formulae (P1) and (P2).
Figure 2A:
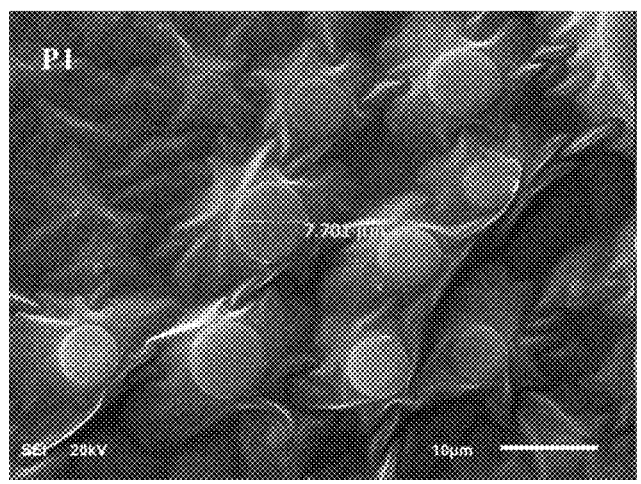
FIG. 2A is a scanning electron microscopy (SEM) image of copolymer of formula (P1).
Figure 2B:
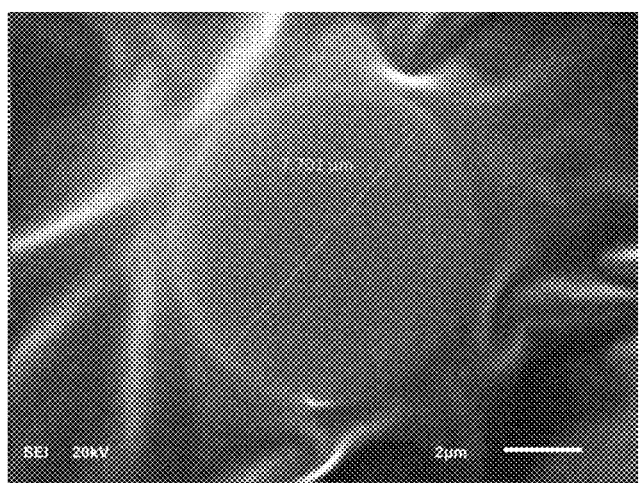
FIG. 2B is a magnified view of the sample in FIG. 2A.
Figure 3A:
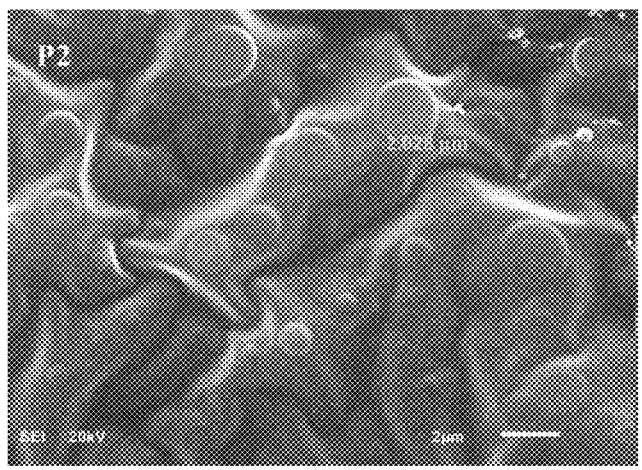
FIG. 3A is a scanning electron microscopy (SEM) image of copolymer of formula (P2).
Figure 3B:
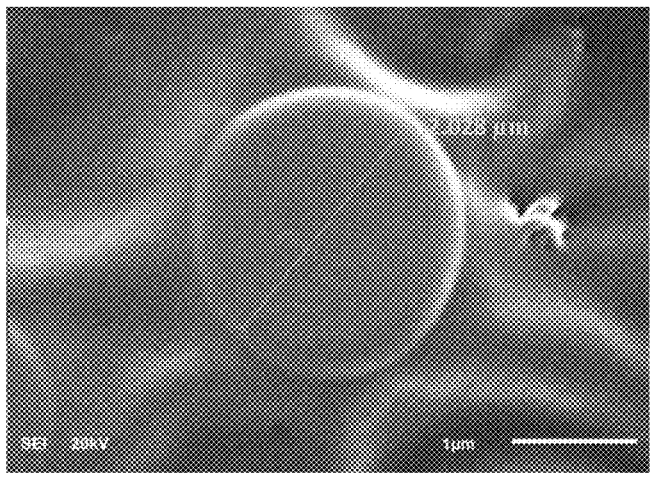
FIG. 3B is a magnified view of the sample in FIG. 3A.

Embodiments of the present disclosure will now be described more fully hereinafter with reference to the accompanying drawings, in which some, but not all embodiments of the disclosure are shown.

The present disclosure will be better understood with reference to the following definitions. As used herein, the words "a" and "an" and the like carry the meaning of "one or more". Within the description of this disclosure, where a numerical limit or range is stated, the endpoints are included unless stated otherwise. Also, all values and subranges within a numerical limit or range are specifically included as if explicitly written out.

As used herein, the term "solvate" refers to a physical association of a compound of this disclosure with one or more solvent molecules, whether organic or inorganic. This physical association includes hydrogen bonding. In certain instances, the solvate will be capable of isolation, for example when one or more solvent molecules are incorporated in the crystal lattice of the crystalline solid. The solvent molecules in the solvate may be present in a regular arrangement and/or a non-ordered arrangement. The solvate may comprise either a stoichiometric or nonstoichiometric amount of the solvent molecules. Solvate encompasses both solution phase and isolable solvates. Exemplary solvents include, but are not limited to, water, methanol, ethanol, n-propanol, isopropanol, n-butanol, isobutanol, tert-butanol, ethyl acetate and other lower alkanols, glycerine, acetone, dichloromethane (DCM), dimethyl sulfoxide (DMSO), dimethyl acetate (DMA), dimethylformamide (DMF), isopropyl ether, acetonitrile, toluene, N-methylpyrrolidone (NMP), tetrahydrofuran (THF), tetrahydropyran, other cyclic mono-, di- and tri-ethers, polyalkylene glycols (e.g. polyethylene glycol, polypropylene glycol, propylene glycol), and mixtures thereof in suitable proportions. Exemplary solvates include, but are not limited to, hydrates, ethanolates, methanolates, isopropanolates and mixtures thereof. Methods of solvation are generally known to those skilled in the art.

As used herein, the term "tautomer" refers to constitutional isomers of organic compounds that readily convert by tautomerization or tautomerism. The interconversion commonly results in the formal migration of a hydrogen atom or proton, accompanied by a switch of a single bond and adjacent double bond. Tautomerism is a special case of structural isomerism, and because of the rapid interconversion, tautomers are generally considered to be the same chemical compound. In solutions in which tautomerization is possible, a chemical equilibrium of the tautomers will be reached. The exact ratio of the tautomers depends on several factors including, but not limited to, temperature, solvent and pH. Exemplary common tautomeric pairs include, but are not limited to, ketone and enol, enamine and imine, ketene and ynol, nitroso and oxime, amide and imidic acid, lactam and lactim (an amide and imidic tautomerism in heterocyclic rings), and open-chain and cyclic forms of an acetal or hemiacetal (e.g., in reducing sugars).

As used herein, the term "stereoisomer" refers to isomeric molecules that have the same molecular formula and sequence of bonded atoms (i.e. constitution), but differ in the three-dimensional orientations of their atoms in space. This contrasts with structural isomers, which share the same molecular formula, but the bond connection of their order differs. By definition, molecules that are stereoisomers of each other represent the same structural isomer. Enantiomers are two stereoisomers that are related to each other by reflection, they are non-superimposable mirror images. Every stereogenic center in one has the opposite configuration in the other. Two compounds that are enantiomers of each other have the same physical properties, except for the direction in which they rotate polarized light and how they interact with different optical isomers of other compounds. Diastereomers are stereoisomers not related through a reflection operation, they are not mirror images of each other. These include meso compounds, cis- and trans- (E- and Z-) isomers, and non-enantiomeric optical isomers. Diastereomers seldom have the same physical properties. In terms of the present disclosure, stereoisomers may refer to enantiomers, diastereomers, or both.

Conformers, rotamers, or conformational isomerism refers to a form of isomerism that describes the phenomenon of molecules with the same structural formula but with different shapes due to rotations around one or more bonds. Different conformations can have different energies, can usually interconvert, and are very rarely isolatable. There are some molecules that can be isolated in several conformations. Atropisomers are stereoisomers resulting from hindered rotation about single bonds where the steric strain barrier to rotation is high enough to allow for the isolation of the conformers. In terms of the present disclosure, stereoisomers may refer to conformers, atropisomers, or both.

In terms of the present disclosure, stereoisomers of the double bonds, ring systems, stereogenic centers, and the like can all be present in the compounds, and all such stable isomers are contemplated in the present disclosure. Cis- and trans- (or E- and Z-) stereoisomers of the compounds of the present disclosure wherein rotation around the double bond is restricted, keeping the substituents fixed relative to each other, are described and may be isolated as a mixture of isomers or as separated isomeric forms. S- and R- (or L- and D-) stereoisomers of the compounds of the present disclosure are described and may be isolated as a mixture of isomers or as separated isomeric forms. All processes or methods used to prepare compounds of the present disclosure and intermediates made therein are considered to be part of the present disclosure. When stereoisomeric products are prepared, they may be separated by conventional methods, for example, by chromatography, fractional crystallization, or use of a chiral agent.

The present disclosure is further intended to include all isotopes of atoms occurring in the present compounds. Isotopes include those atoms having the same atomic number but different mass numbers. By way of general example, and without limitation, isotopes of hydrogen include deuterium and tritium, isotopes of carbon include $^{13}C$ and $^{14}C$, isotopes of nitrogen include $^{15}N$, and isotopes of oxygen include $^{17}O$ and $^{18}O$. Isotopically labeled compounds of the disclosure can generally be prepared by conventional techniques known to those skilled in the art or by processes and methods analogous to those described herein, using an appropriate isotopically labeled reagent in place of the non-labeled reagent otherwise employed.

As used herein, the term "substituted" refers to at least one hydrogen atom that is replaced with a non-hydrogen group, provided that normal valencies are maintained and that the substitution results in a stable compound. When a substituent is noted as "optionally substituted", the substituents are selected from the exemplary group including, but not limited to, halo, hydroxyl, alkoxy, oxo, alkanoyl, aryloxy, alkanoyloxy, amino, alkylamino, arylamino, arylalkylamino, disubstituted amines (e.g. in which the two amino substituents are selected from the exemplary group including, but not limited to, alkyl, aryl or arylalkyl), alkanylamino, aroylamino, aralkanoylamino, substituted alkanoylamino, substituted arylamino, aubstituted aralkanoylamino, thiol, alkylthio, arylthio, arylalkylthio, alkylthiono, arylthiono, aryalkylthiono, alkylsulfonyl, arylsulfonyl, arylalkylsulfonyl, sulfonamide (e.g. $—SO_2NH_2$), substituted sulfonamide, nitro, cyano, carboxy, carbamyl (e.g. $—CONH_2$), substituted carbamyl (e.g. —CONHalkyl, —CONHaryl, —CONHarylalkyl or cases where there are two substituents on one nitrogen from alkyl, aryl, or alkylalkyl), alkoxycarbonyl, aryl, substituted aryl, guanidine, heterocyclyl (e.g. indolyl, imidazoyl, furyl, thienyl, thiazolyl, pyrrolidyl, pyridyl, pyrimidiyl, pyrrolidinyl, piperidinyl, morpholinyl, piperazinyl, homopiperazinyl and the like), substituted heterocyclyl and mixtures thereof and the like. The substituents may themselves be optionally substituted, and may be either unprotected, or protected as necessary, as known to those skilled in the art, for example, as taught in Greene, et al., "Protective Groups in Organic Synthesis", John Wiley and Sons, Second Edition, 1991, hereby incorporated by reference in its entirety.

As used herein, the term "alkyl" unless otherwise specified refers to both branched and straight chain saturated aliphatic primary, secondary, and/or tertiary hydrocarbons of typically $C_1$ to $C_{20}$, preferably $C_6$-$C_{18}$, more preferably $C_{10}$-$C_{16}$, for example $C_1$, $C_2$, $C_3$, $C_4$, $C_5$, $C_6$, $C_7$, $C_8$, $C_9$, $C_{10}$, $C_{11}$, $C_{12}$, and specifically includes, but is not limited to, methyl, trifluoromethyl, ethyl, propyl, isopropyl, cyclopropyl, butyl, isobutyl, t-butyl, pentyl, cyclopentyl, isopentyl, neopentyl, hexyl, isohexyl, cyclohexyl, cyclohexylmethyl, 3-methylpentyl, 2,2-dimethylbutyl, 2,3-dimethylbutyl, 2-ethylhexyl, heptyl, octyl, nonyl, 3,7-dimethyloctyl, decyl, undecyl, dodecyl, tridecyl, 2-propylheptyl, tetradecyl, pentadecyl, hexadecyl, heptadecyl, octadecyl, nonadecyl, and eicosyl. As used herein, the term optionally includes substituted alkyl groups. Exemplary moieties with which the alkyl group can be substituted may be selected from the group including, but not limited to, hydroxyl, amino, alkylamino, arylamino, alkoxy, aryloxy, nitro, cyano, sulfonic acid, sulfate, phosphonic acid, phosphate, halo, or phosphonate or mixtures thereof. The substituted moiety may be either protected or unprotected as necessary, and as known to those skilled in the art.

The term "cycloalkyl" refers to cyclized alkyl groups. Exemplary cycloalkyl groups include, but are not limited to, cyclopropyl, cyclobutyl, cyclopentyl, cyclohexyl, norbornyl, and adamantyl. Branched cycloalkyl groups such as exemplary 1-methylcyclopropyl and 2-methylcyclopropyl groups are included in the definition of cycloalkyl as used in the present disclosure.

The term "arylalkyl", as used herein, refers to a straight or branched chain alkyl moiety having 1 to 8 carbon atoms that is substituted by an aryl group as defined herein, and includes, but is not limited to, benzyl, phenethyl, 2-methylbenzyl, 3-methylbenzyl, 4-methylbenzyl, 2,4-dimethylbenzyl, 2-(4-ethylphenyl)ethyl, 3-(3-propylphenyl)propyl, and the like.

As used herein, the term "aryl" unless otherwise specified refers to functional groups or substituents derived from an aromatic ring including, but not limited to, phenyl, biphenyl, napthyl, thienyl, and indolyl. As used herein, the term optionally includes both substituted and unsubstituted moieties. Exemplary moieties with which the aryl group can be substituted may be selected from the group including, but not limited to, hydroxyl, amino, alkylamino, arylamino, alkoxy, aryloxy, nitro, cyano, sulfonic acid, sulfate, phosphonic acid, phosphate or phosphonate or mixtures thereof. The substituted moiety may be either protected or unprotected as necessary, and as known to those skilled in the art.

The term "alkoxy" refers to a straight or branched chain alkoxy including, but not limited to, methoxy, ethoxy, propoxy, isopropoxy, butoxy, isobutoxy, secondary butoxy, tertiary butoxy, pentoxy, isopentoxy, hexyloxy, heptyloxy, octyloxy, nonyloxy, and decyloxy.

The term "alkanoyl" refers to an alkyl group of specified number of carbon atoms that is bound to an oxygen atom through a double bond. Exemplary alkanoyl groups include, but are not limited to, formyl, acetyl, propanoyl, butyryl, and hexanoyl.

The term "aroyl" as used in this disclosure refers to an aromatic carboxylic acyl group includes, for example, benzoyl, 1-naphthoyl, and 2-naphthoyl.

The term "halogen", as used herein, means fluoro, chloro, bromo and iodo.

According to a first aspect, the present disclosure relates to a copolymer of formula (I)

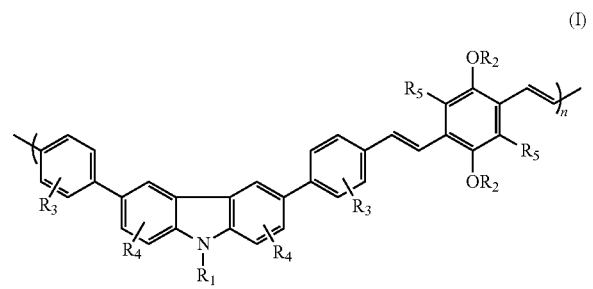

(I)

or a salt thereof, a solvate thereof, a tautomer thereof, a stereoisomer thereof, or a mixture thereof wherein (i) $R_1$ is selected from the group consisting of a hydrogen, an optionally substituted alkyl, an optionally substituted cycloalkyl, an optionally substituted arylalkyl, an optionally substituted aryl, an optionally substituted alkanoyl, and an optionally substituted aroyl, (ii) each $R_2$ is independently selected from the group consisting of an optionally substituted alkyl, an optionally substituted cycloalkyl, an optionally substituted aryl, and an optionally substituted arylalkyl, (iii) each $R_3$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, (iv) each $R_4$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, and an optionally substituted aroyl, (v) each $R_5$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, and (vi) n is a positive integer in a range of 2-10,000.

As described herein, the term "repeat unit" or "repeating unit" refers to a part of the polymer or resin whose repetition would produce the complete polymer chain (including or excluding the end groups) by linking the repeating units together successively along the chain. Monomers are molecules which can undergo polymerization, thereby contributing constitutional repeating units to the structures of a macromolecule or polymer. The process by which monomers combine end to end to form a polymer is referred to herein as "polymerization" or "polycondensation". As used herein a "copolymer" refers to a polymer derived from more than one species of monomer and are obtained by "copolymerization" of more than one species of monomer. Copolymers obtained by copolymerization of two monomer and/or oligomer species may be termed bipolymers, those obtained from three monomers may be termed terpolymers and those obtained from four monomers may be termed quarterpolymers, etc. In some embodiments, the copolymer of the present disclosure is a terpolymer, for example a terpolymer obtained from reaction between a dialdehyde and a mixture of two diphosphonates. In a preferred embodiment, the copolymer of the present disclosure is a bipolymer obtained from reaction between a dialdehyde and a diphosphonate.

The term "degree of polymerization" refers to the number of repeating units in a polymer. In a preferred embodiment, degree of polymerization n is a positive integer in the range of 2-10,000, preferably 3-1,000, preferably 4-500, preferably 5-100, preferably 6-90, preferably 7-80, preferably 8-70, preferably 9-60, preferably 10-50, preferably 11-40, preferably 12-30, preferably 13-25, preferably 14-20. It is equally envisaged that values for n may fall outside of these ranges and still provide suitable copolymers of formula (I). In a preferred embodiment, the copolymer of the present disclosure may have a wide molecular weight distribution. In one embodiment, the copolymer of the present disclosure has an average molecular weight of 2-100 kDa, preferably 5-80 kDa, preferably 10-60 kDa, preferably 15-40 kDa, preferably 18-35 kDa, preferably 20-30 kDa.

In one or more embodiments, each $R_3$, $R_4$ and $R_5$ are a hydrogen. In one or more embodiments, $R_1$ is a hydrogen or an optionally substituted alkyl. Within the same repeating unit, each $R_2$ may be the same or may be different groups. In one or more embodiments, each $R_2$ is independently an optionally substituted alkyl.

In one or more embodiments, $R_1$ is a $C_4$ to $C_{10}$ alkyl group, preferably a $C_5$ to $C_9$ alkyl group, more preferably a $C_8$ alkyl group, most preferably 2-ethylhexyl, and each $R_2$ is independently a $C_6$ to $C_{14}$ alkyl group, preferably a $C_7$ to $C_{13}$ alkyl group, more preferably a $C_8$ to $C_{12}$ alkyl group, most preferably 2-ethylhexyl or dodecyl.

In one or more embodiments, the copolymer has a formula selected from the group consisting of

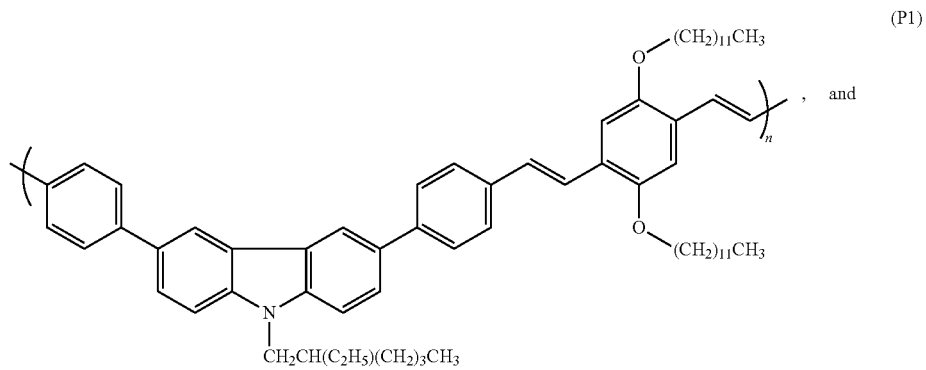

(P1)

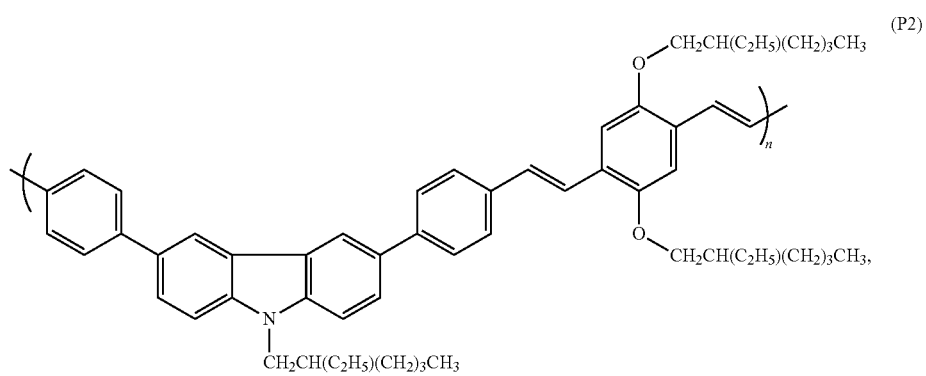

(P2)

wherein n is a positive integer in the range of 2-10000, preferably 3-1000, preferably 4-500, preferably 5-100, preferably 6-90, preferably 7-80, preferably 8-70, preferably 9-60, preferably 10-50, preferably 11-40, preferably 12-30, preferably 13-25, preferably 14-20, for each of formulae (P1) and (P2).

There are in principle a relatively large number of different reactions for the formation of alkene (C=C) bond suitable for the purpose of current disclosure, which include, but are not limited to, Wittig reaction, Peterson olefination, Barton-Kellogg reaction, McMurry reaction, Ramberg-Backlund rearrangement, and Olefin metathesis. Horner-Wadsworth-Emmons (HWE) reaction is a more specific example of Wittig reaction, which involves reacting phosphonates with aldehydes (or ketones) under basic conditions to produce corresponding (E)-alkene compounds. In at least one embodiment, polymerization reactions of HWE type are utilized to prepare the copolymer of formula (I).

According to a second aspect, the present disclosure relates to a method of producing the copolymer of the first aspect, the method involving reacting a dialdehyde of formula (II)

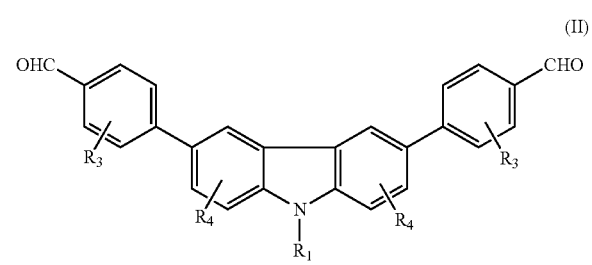

(II)

or a salt, solvate, tautomer or stereoisomer thereof, with a diphosphonate of formula (III)

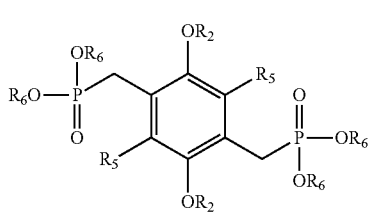

or a salt, solvate, tautomer or stereoisomer thereof in the presence of a base to form the copolymer, wherein (i) $R_1$ is selected from the group consisting of a hydrogen, an optionally substituted alkyl, an optionally substituted cycloalkyl, an optionally substituted arylalkyl, an optionally substituted aryl, an optionally substituted alkanoyl, and an optionally substituted aroyl, (ii) each $R_2$ is independently selected from the group consisting of an optionally substituted alkyl, an optionally substituted cycloalkyl, an optionally substituted aryl, and an optionally substituted arylalkyl, (iii) each $R_3$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, (iv) each $R_4$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, and an optionally substituted aroyl, (v) each $R_5$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, and (vi) each $R_6$ is an optionally substituted alkyl or an optionally substituted arylalkyl.

In a preferred embodiment, reacting the dialdehyde with the diphosphonate in the presence of a base to form the copolymer of formula (I) is performed in a polar aprotic solvent (e.g. tetrahydrofuran, dimethylformamide, acetonitrile) under an inert gas such as $N_2$, Ar, He. For example, the inert gas may be bubbled in the reaction mixture in a sealed container for at least 0.5 hour, 1 hour, or at least 2 hours before and/or during the reaction. The reaction is conducted under agitation, preferably using a magnetic stirrer at a temperature of 20-150° C., preferably 40-140° C., preferably 60-130° C., preferably 80-120° C., or about 100° C. for up to 48 hours, preferably 2-44 hours, preferably 8-38 hours, preferably 12-32 hours, preferably 18-30 hours, or about 24 hours. In a preferred embodiment, the reaction is performed at a concentration of the dialdehyde in the range of 0.1-1,000 mM, preferably 0.5-500 mM, preferably 1-100 mM, preferably 10-50 mM, preferably 20-40 mM. In a preferred embodiment, the reaction is performed at a concentration of the diphosphonate in the range of 0.1-1,000 mM, preferably 0.5-500 mM, preferably 1-100 mM, preferably 10-50 mM, preferably 20-40 mM. The base may be present at a concentration in the range of 1-10,000 mM, preferably 10-1,000 mM, preferably 50-500 mM, preferably 100-250 mM. Exemplary bases that may be suitable for the reaction include, but are not limited to, sodium tert-butoxide, potassium tert-butoxide, 1,8-diazabicycloundec-7-ene, 1,5-diazabicyclo(4.3.0)non-5-ene, n-butyllithium, tert-butyllithium, lithium diisopropylamide, sodium hydride, potassium hydride, sodium methoxide, and sodium carbonate, preferably sodium tert-butoxide is employed. In a preferred embodiment, a molar ratio of the dialdehyde of formula (II) to the diphosphonate of formula (III) is in the range of 1:3 to 3:1, preferably 1:2 to 2:1, preferably 2:3 to 3:2, or about 1:1. In a preferred embodiment, a molar ratio of the dialdehyde to the base is in the range of 1:1 to 1:30, preferably 1:2 to 1:20, preferably 1:3 to 1:10, preferably 1:4 to 1:8, or about 1:5.

In a preferred embodiment, the copolymer is collected as a solid that may be separated (filtered off) from the aforementioned reaction, washed in tetrahydrofuran, methanol, iso-propanol, and/or hexanes, and then filtered and dried. In a preferred embodiment, the reaction forming the copolymer of formula (I) has a product yield of at least 30%, preferably at least 40%, preferably at least 45%, preferably at least 50%, preferably at least 55%, preferably at least 60%, preferably at least 65%, preferably at least 70%. The product yield is calculated as (mass of product/total mass of reactants, i.e., dialdehyde+diphosphonate)×100%.

The starting monomers used in the aforementioned methods including dialdehydes and diphosphonates may be commercially available or prepared in-house according to methods known to one of ordinary skill in the art. For example, details regarding the synthetic procedures for the diphosphate of Formula (III) may be found, e.g. in [Hisatomi T, Kubota J, Domen K. Recent advances in semiconductors for photocatalytic and photoelectrochemical water splitting. Chem Soc Rev 2014; 43:7520-35; and Kim J, Kim S H, Kim J, Kim I, Jin Y, Kim J H, et al. Di-aryl substituted poly (cyclopenta[def]phenanthrene) derivatives containing carbazole and triphenylamine units in the main chain for organic light-emitting diodes. Macromol Res 2011; 19:589-98, each incorporated herein by reference in their entirety]. For another example, the dialdehyde of formula (II) may be prepared by the Suzuki-Miyaura method as follows. A boronic ester of formula (II-i)

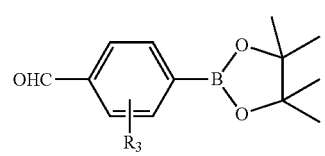

may be mixed with a suitable 3,6-dihalocarbazole of formula (II-ii)

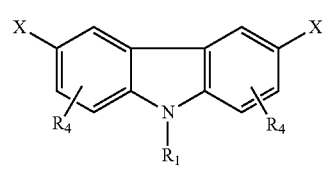

wherein each X is a halogen including chloro, bromo and iodo, preferably each X is a bromo in the presence of a base (e.g. sodium carbonate, potassium carbonate, sodium hydroxide, potassium hydroxide, sodium tert-butoxide, potassium tert-butoxide) and a catalyst (e.g. [1,1'-bis(diphenylphosphino)ferrocene]dichloropalladium(II) [PdCl$_2$(dppf)], palladium-tetrakis(triphenylphosphine) [Pd(PPh$_3$)$_4$], palladium(II) acetate [Pd(OAc)$_2$], bis(dibenzylideneacetone)palladium [Pd(dba)$_2$]) in a solvent (e.g. water, toluene, methanol, ethanol, dioxane, tetrahydrofuran, or mixtures thereof), thereby forming a mixture. In a preferred embodiment, a mixture of water and toluene at a volume ratio of 3:1-1:3, 2:1-1:2, or about 1:1 is employed as the solvent. A concentration of boronic ester of formula (II-i) in the mixture may be in the range of 0.01-2.0 M, 0.1-1.0 M, or 0.2-0.4 M. A concentration of 3,6-dihalocarbazole of formula (II-ii) in the mixture may be in the range of 0.001-1.0 M, 0.01-0.5 M, or 0.05-0.2 M. A concentration of base in the mixture may be in the range of 0.01-4 M, 0.1-2 M, or 0.3-1.0 M. A concentration of catalyst in the mixture may be in the range of 0.005-0.2 M, 0.01-0.1 M, or 0.02-0.05 M. A molar ratio of the boronic ester to the 3,6-dihalocarbazole may be in the range of 1:1 to 5:1, 2:1 to 4:1, or about 2.5:1. A molar ratio of the boronic ester to the base may be in the range of 1:1 to 1:4, or 1:2 to 1:3. A molar ratio of the boronic ester to the catalyst may be in the range of 100:1 to 5:1, 50:1 to 10:1, or 25:1 to 10:1. The reaction may be performed under an inert gas such as N$_2$, Ar, He. For example, the inert gas may be bubbled in the reaction mixture in a sealed container for at least 0.5 hour, 1 hour, or at least 2 hours before and/or during the reaction. The mixture may be agitated and/or heated to a temperature range of 30-100° C., 40-70° C., or 45-60° C. by an oil-bath, a water-bath, or a sand-bath for 1 to 24 hours, 3 to 18 hours, 6 to 15 hours, or about 12 hours to form a final reaction mixture. Subsequently, the dialdehyde of formula (II) may be isolated and purified from the final reaction mixture using methods known to one skilled in the art such as filtration, work-up, extraction with organic solvents, distillation, crystallization, column chromatography, and high-performance liquid chromatography (HPLC). A yield of the dialdehyde may be at least 50%, preferably at least 60%, preferably at least 70%, preferably at least 80%, preferably at least 85%, preferably at least 90% by mole relative to a total mole of starting material 3,6-dihalocarbazole of formula (II-ii). Methods of agitating a reaction mixture include, without limitation, using an agitator, a vortexer, a rotary shaker, a magnetic stirrer, a centrifugal mixer, an overhead stirrer, an ultrasonic probe, or placing the reaction mixture in an ultrasonic bath.

The present disclosure is intended to include a mixed copolymer formed by employing more than one dialdehyde of formula (II) with different substitutions at $R_1$, $R_3$, and/or $R_4$, and/or more than one diphosphonate of formula (III) with different substitutions at $R_2$ and/or $R_5$ in a polycondensation. An exemplary structure of the formed mixed copolymer may be represented by formula (IV)

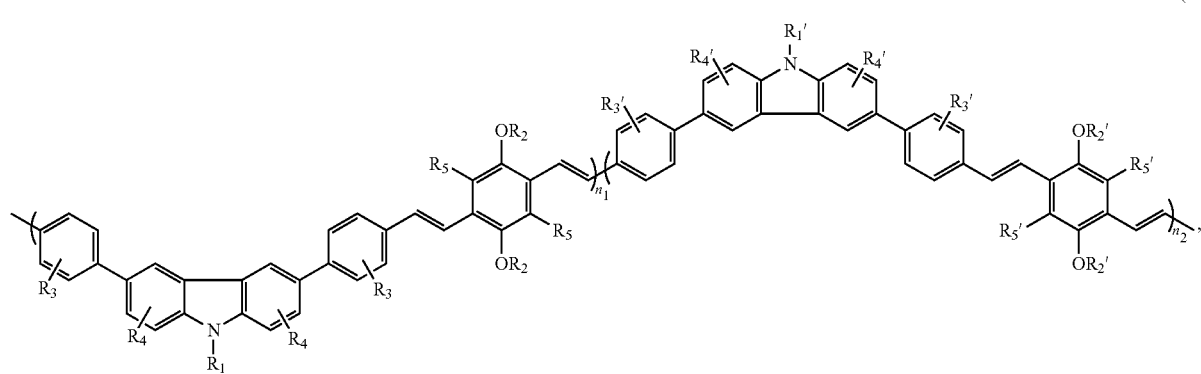

(IV)

wherein (i) $R_1$ and $R_1'$ are selected from the group consisting of a hydrogen, an optionally substituted alkyl, an optionally substituted cycloalkyl, an optionally substituted arylalkyl, an optionally substituted aryl, an optionally substituted alkanoyl, and an optionally substituted aroyl, (ii) each $R_2$ and $R_2'$ are independently selected from the group consisting of an optionally substituted alkyl, an optionally substituted cycloalkyl, an optionally substituted aryl, and an optionally substituted arylalkyl, (iii) each $R_3$ and $R_3'$ are independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, (iv) each $R_4$ and $R_4'$ are independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, and an optionally substituted aroyl, (v) each $R_5$ and $R_5'$ are independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano, (vi) $n_1$ and $n_2$ are independently a positive integer in the range of 2-10000, and (vii) $R_1 \neq R_1'$, $R_2 \neq R_2'$, $R_3 \neq R_3'$, $R_4 \neq R_4'$, and/or $R_5 \neq R_5'$. In certain embodiments, the copolymer described herein may be formed by employing a single dialdehyde of formula (II) with the same substitutions at $R_1$, $R_3$, and $R_4$ ($R_1 = R_1'$, $R_3 = R_3'$, and $R_4 = R_4'$) and more than one diphosphonate of formula (III) with different substitutions at $R_2$ and/or $R_5$ ($R_2 \neq R_2'$, and/or $R_5 \neq R_5'$) in a polycondensation. In other embodiments, the copolymer may be formed by employing more than one dialdehyde of formula (II) with different substitutions at $R_1$, $R_3$, and/or $R_4$ ($R_1 \neq R_1'$, $R_3 \neq R_3'$, and/or $R_4 \neq R_4'$), and a single diphosphonate of formula (III) with the same substitutions at $R_2$ and $R_5$ ($R_2 = R_2'$, and $R_5 = R_5'$) in a polycondensation. In a preferred embodiment, the copolymer is formed by a single dialdehyde of formula (II) ($R_1=R_1'$, $R_3=R_3'$, and $R_4=R_4'$) and a single diphosphonate of formula (III) ($R_2=R_2'$, and $R_5=R_5'$).

The copolymer disclosed herein may be a block copolymer, an alternating copolymer, a periodic copolymer, a gradient copolymer, or a statistical copolymer. Block copolymers comprise two or more homopolymer subunits linked by covalent bonds. The union of the homopolymer subunits may require an intermediate non-repeating subunit, known as a junction block. Block copolymers with two or three distinct blocks are called diblock copolymers and triblock copolymers, respectively. Statistical copolymers are copolymers in which the sequence of monomer residues follows a statistical rule. That is, the probability of finding a particular monomer residue at a particular point in the chain is equal to the mole fraction of that monomer residue in the chain. The statistical copolymer may be referred to as a truly random copolymer. Periodic copolymers have the monomers arranged in a repeating sequence. In an embodiment where only one type of diphosphonate is present as the first monomer, only one type of dialdehyde is present as the second monomer, and the mole ratio of the first monomer to the second monomer is about 1:1, the copolymer is an alternating copolymer with regular alternating A and B units (e.g., $(A-B)_n$), where A represents the first monomer and B represents the second monomer. In another embodiment, the copolymer may be a gradient copolymer which exhibits a gradual change in composition along the polymer chain from mostly A units to mostly B units.

A particle is defined as a small object that behaves as a whole unit with respect to its transport and properties. The copolymer of the present disclosure in any of its embodiments may be in the form of particles of the same shape or different shapes, and of the same size or different sizes. An average diameter (e.g., average particle diameter) of the particle, as used herein, refers to the average linear distance measured from one point on the particle through the center of the particle to a point directly across from it. Microparticles are particles having an average diameter between 0.1 and 100 μm in size. Nanoparticles are particles having an average diameter between 1 and 100 nm in size. In one embodiment, the copolymer described herein may be microparticles having an average diameter in a range of 0.1-100 μm, 0.5-50 μm, 1-40 μm, 2-30 μm, 3-25 μm, 4-20 μm, 5-15 μm, 6-10 μm, or 7-9 μm. In another embodiment, the copolymer may be nanoparticles having an average diameter in a range of 1-99 nm, 5-90 nm, 10-80 nm, 20-70 nm, 30-60 nm, or 40-50 nm. In a preferred embodiment, the copolymer is in the form of microparticles.

The particles (e.g. nanoparticles, microparticles) of the copolymer may be spherical, ellipsoidal, oblong, ovoidal, or some other rounded shape. In an alternative embodiment, the particles may be angular, rectangular, prismoidal, or some other angular shape. In a preferred embodiment, the particles are spherical. Microspheres are spherical microparticles. In a more preferred embodiment, the copolymer is in the form of microspheres having a diameter of 0.1-50 μm, 1-40 μm, 2-30 μm, 3-25 μm, 4-20 μm, 5-15 μm, 6-10 μm, or 7-9 μm. The size and shape of particles may be analyzed by techniques such as dynamic light scattering (DLS), scanning electron microscopy (SEM), transmission electron microscopy (TEM), and/or atomic force microscopy (AFM).

As used herein, fluorescence is the emission of light by a substance that has absorbed light or other electromagnetic radiation. It is a form of luminescence. However, unlike phosphorescence, where the substance would continue to glow and emit light for some time after the radiation source has been turned off, fluorescent materials would cease to glow immediately upon removal of the excitation source. Hence, it is not a persistent phenomenon. Fluorescence occurs when an orbital electron of a molecule, atom, or nanostructure relaxes to its ground state by emitting a photon from an excited singlet state. In most cases, the emitted light has a longer wavelength, and therefore lower energy, than the absorbed radiation in a phenomenon known as the Stokes shift. Many molecules that fluoresce are conjugated systems. In a preferred embodiment, the copolymer of formula (I) in an organic solvent (e.g. THF, methylene chloride, chloroform) has a fluorescence emission peak of 430-610 nm, preferably 450-590 nm, preferably 470-570 nm, preferably 490-560 nm, preferably 520-550 nm, preferably 530-545 nm at an excitation wavelength of 370-410 nm, preferably 380-400 nm, preferably 382-398 nm, preferably 384-396 nm, preferably 386-394 nm, preferably 388-392 nm, or about 390 nm. In some embodiments, copolymer of formula (P1) has emission peaks with a shorter wavelength relative to those of copolymer of formula (P2) by at least 2 nm, 5 nm, 7 nm, 8 nm, 9 nm, or 10 nm. In some embodiments, the copolymer of formula (I) has a Stokes shift of at least 5 nm, 10 nm, 15 nm, 20 nm, 25 nm, or 30 nm, which is calculated based on the difference between emission and excitation peaks.

As used herein, quantum yield (ϕ) refers to the fluorescence quantum yield and gives the efficiency of the fluorescence process. It is defined as the ratio of the number of photons emitted to the number of photons absorbed. The maximum fluorescence quantum yield is 1.0 (100%); wherein each photon absorbed results in a photon emitted. An alternative way to define the quantum yield of fluorescence is by the rate of excited state decay. In a preferred embodiment, the copolymer of formula (I) has a quantum yield in a range of 0.02-0.9, preferably 0.05-0.8, preferably 0.1-0.7, preferably 0.2-0.6, preferably 0.3-0.5 for its fluorescence emission peak 430-610 nm, preferably 450-590 nm, preferably 470-570 nm, preferably 490-560 nm, preferably 520-550 nm, preferably 530-545 nm at an excitation wavelength of 370-410 nm, preferably 380-400 nm, preferably 382-398 nm, preferably 384-396 nm, preferably 386-394 nm, preferably 388-392 nm, or about 390 nm. In some embodiments, copolymer of formula (P1) has a higher fluorescence quantum yield than copolymer of formula (P2) by at least 40%, 60%, 80%, 100%, or at least 120%.

As defined herein, conjugated polymers are polymers which contain mainly $sp^2$-hybridized (or also sp-hybridized) carbon atoms in the main chain, which may also be replaced by appropriate heteroatoms. In the simplest case, this means the presence of alternating double and single bonds in the main chain. Naturally occurring defects or minor impurities which lead to interruptions to the conjugation do not invalidate the term "conjugated polymers". Furthermore, a polymer in which, for example, carbazole units such as the N-substituted diphenylcarbazole of formula (I) or other such units and/or particular heterocycles (i.e. conjugation via N, O or S atoms) are present in the main chain is likewise described as conjugated in the present disclosure. On the other hand, units such as simple (thio)ether bridges, ester linkages, amide or imide linkages would be unambiguously defined as non-conjugated segments. In one or more embodiments, the copolymer disclosed herein is a conjugated polymer.

As used herein, band gap energy ($E_g$), band gap, and/or energy gap refers to an energy range in a solid where no electron states can exist. In graphs of the electronic band structure of solids, the band gap generally refers to the energy difference (in electron volts) between the top of the valence band and the bottom of the conduction band in insulators and/or semiconductors. It is generally the energy required to promote a valence electron bound to an atom to become a conduction electron, which is free to move within the crystal lattice and serve as a charge carrier to conduct electric current. Optoelectronic materials such as conjugated polymers are generally classified according to their band gap, which is closely related to the HOMO/LUMO gap in chemistry. Band gap energies for copolymers described herein may be obtained using optical spectroscopies, e.g. UV-vis spectroscopy and/or electrochemical measurements, e.g. cyclic voltammetry (CV) and differential pulse voltammetry (DPV). In one or more embodiments, the copolymer of the present disclosure in any of its embodiments has a band gap energy of 1.6-3.0 eV, 1.8-2.9 eV, 2.0-2.8 eV, 2.1-2.7 eV, 2.2-2.6 eV, or 2.3-2.5 eV. However, in some embodiments, the band gap energy may be less than 1.4 eV or greater than 3.0 eV.

According to a third aspect, the present disclosure relates to a photoelectrode, comprising a metal oxide conducting substrate, and a layer comprising the copolymer of formula (I) deposited over the metal oxide conducting substrate. Additionally, the layer has a thickness in a range of 5-1000 nm, 10-800 nm, 20-600 um, 40-400 nm, 60-300 nm, 80-200 nm, 100-180 nm, 120-160 nm, or 130-150 nm. In one embodiment, the copolymer of formula (I) is present in an amount of 50-99.9 wt %, preferably 55-99 wt %, preferably 60-95 wt %, preferably 65-90 wt %, preferably 70-85 wt %, preferably 75-80 wt % relative to a total weight of the layer. However, in some embodiments, the copolymer is present in an amount of less than 50 wt % or greater than 99.9 wt % relative to a total weight of the layer.

The copolymer may be deposited onto the metal oxide conducting substrate via various techniques including, without limitation, chemical vapor deposition, atomic layer deposition, chemical solution deposition by dip coating, spin coating or spraying, Langmuir-Blodgett method, sputter deposition, cathodic arc deposition, pulsed laser deposition, lithography, or thermal evaporation method. In a preferred embodiment, the layer comprising the copolymer of formula (I) is produced by chemical deposition. In a more preferred embodiment, dip coating method is employed by dipping a substrate in a solution of the copolymer in an organic solvent (e.g. THF, methylene chloride, chloroform, acetone, acetonitrile) at a concentration of 0.1-100 g/L, 1-50 g/L, 2-25 g/L, 3-20 g/L, 4-15 g/L, or 5-10 g/L for 5-120 min, 10-60 min, or 15-45 min to prepare an initial photoelectrode. The initial photoelectrode may be removed from the solution and dried in air, or in an oven, or over a hot plate at a temperature of 50-120° C., 60-110° C., 70-100° C., or 80-90° C. for 0.25-6 hours, 0.5-4 hours, or 1-3 hours to produce the photoelectrode. In an alternative embodiment, the photoelectrode of the third aspect may be formed by lithography, preferably nanolithography. Nanolithography techniques may be categorized as in series or parallel, mask or maskless/direct-write, top-down or bottom-up, beam or tip-based, resist-based or resist-less methods all of which are acceptable in terms of the present disclosure. Exemplary nanolithography techniques include, but are not limited to, optical lithography, photolithography, directed self-assembly, extreme ultraviolet lithography, electron beam lithography, electron beam direct write lithography, multiple electron beam lithography, nanoimprint lithography, step-and-flash imprint lithography, multiphoton lithography, scanning probe lithography, dip-pen nanolithography, thermochemical nanolithography, thermal scanning probe lithography, local oxidation nanolithography, molecular self-assembly, stencil lithography, X-ray lithography, laser printing of single nanoparticles, magnetolithography, nanosphere lithography, proton beam writing, charged particle lithography, ion projection lithography, electron projection lithography, neutral particle lithography and mixtures thereof. In another alternative embodiment, the photoelectrode may be synthesized by two or more techniques, for instance, a chemical solution deposition method and then a nanolithography etching method to form a nanostructure having an increased surface area and/or appropriate patterns for photoelectrocatalysis.

In some embodiments, additional polymers may be introduced to disperse the copolymer of formula (I) in solid state and add physical strength and durability and portability to the photoelectrode. Polymers suitable for the purpose of present disclosure include, but are not limited to, polyvinyl chloride (PVC), polystyrene (PS), polyethylene (PE), and poly(methyl methacrylate) (PMMA). It is equally envisaged that the photoelectrode described herein may be adapted to incorporate additional polymers such as polyurethane, polyethylene terephthalate, polyester, polyvinylidene chloride, polypropylene (PP), polyamides, nylons, polysulfones, fluoropolymers (e.g., polyvinylidene fluoride (PVDF), polytetrafluoroethylene (PTFE)), silicones (e.g., polydimethylsiloxane (PDMS) and polymethylphenyl silicone (PMPS)), acrylonitrile butadiene styrene (ABS), polyethylene/acrylonitrile butadiene styrene (PE/ABS), polycarbonate (PC), and polycarbonate/acrylonitrile butadiene styrene (PC/ABS). In one embodiment, where an additional polymer is introduced, the photoelectrode may be prepared by dipping a substrate to a mixture of the aforementioned polymer, the copolymer of formula (I) of the present disclosure, and an optional solvent. A solvent may be optionally used to help dissolve the polymers and copolymers to form a homogeneous solution, thus disperse the copolymer with the polymer. The solvent is chosen primarily for its ability to completely dissolve the polymers and the copolymer and for the ease of solvent removal in the photoelectrode formation steps. Preferred solvents include dichloromethane, chloroform, acetone, tetrahydrofuran, acetonitrile, diethyl ether, ethyl acetate, pentane, hexanes, dioxanes, methanol, ethanol, and mixtures thereof. A total amount of the additional polymer and the copolymer of the present disclosure may be in a range of 5-50 wt %, 10-40 wt %, or 20-30 wt % relative to a weight of the membrane solution. A weight ratio of the additional polymer relative to the copolymer may be in a range of 1:100, 1:80, 1:60, 1:50, 1:40, 1:30, 1:20, 1:10, 1:5, 1:2, or 1:1.

Exemplary substrates include fluorine doped tin oxide (FTO) film, indium tin oxide (ITO) film, ITO coated polyethylene terephthalate (PET) film, a gold film, gold coated glass, aluminum oxide, titanium oxide, nickel oxide, tungsten oxide, strontium titanate, quartz, and silicon wafer. In a preferred embodiment, a metal oxide conducting substrate is used. In a more preferred embodiment, the metal oxide conducting substrate used is fluorine doped tin oxide. In some embodiments, the layer comprising the copolymer deposited on the substrate has a thickness of 5 nm to 1000 nm, 10 nm to 800 nm, 20 nm to 600 um, 40 nm to 400 nm, 60 nm to 300 nm, 80 nm to 200 nm, 100 nm to 180 nm, 120 nm to 160 nm, or 130 nm to 150 nm. In one embodiment, 70-100%, more preferably 80-99%, more preferably 85-97% of the surface of the metal oxide conducting substrate is covered with the layer comprising the copolymer of formula (I), though in some embodiment, less than 70% of the surface of the metal oxide conducting substrate is covered with the layer comprising the copolymer.

As used herein, UV-vis spectroscopy or UV-vis spectrophotometry refers to absorption spectroscopy or reflectance spectroscopy in the ultraviolet-visible spectral region. This means it uses light in the visible and adjacent (near-UV and near-infrared) ranges. The absorption or reflectance in the visible range directly affects the perceived color of the chemicals involved. In this region of the electromagnetic spectrum, molecules undergo electronic transitions. Molecules containing it-electrons or non-bonding electrons (n-electrons) can absorb the energy in the form of ultraviolet or visible light to excite these electrons to higher antibonding molecular orbitals. The more easily excited the electrons (i.e. the lower the energy gap between the HOMO and the LUMO), the longer the wavelength of light it can absorb. This technique is complementary to fluorescence spectroscopy, in that fluorescence deals with transitions from the excited state to the ground state, while absorption measures transitions from the ground state to the excited state. In one or more embodiments, the photoelectrode described herein has an ultraviolet visible absorption with an absorption edge of 480-680 nm, preferably 500-660 nm, preferably 520-640 nm, preferably 540-620 nm, preferably 560-600 nm, preferably 580-590 nm. In some embodiments, copolymer of formula (P1) has an absorption edge at a shorter wavelength relative to one of copolymer of formula (P2) by at least 5 nm, 6 nm, 7 nm, 8 nm, 9 nm, 10 nm, or at least 20 nm.

According to a forth aspect, the present disclosure relates to a photoelectrochemical cell, comprising the photoelectrode of the third aspect, a counter electrode, and an electrolyte solution comprising water and an inorganic salt in contact with both electrodes. As used herein, the photoelectrode may be considered as the working electrode in the photoelectrochemical cell.

In one embodiment, the photoelectrochemical cell is a vessel having an internal cavity for holding the electrolyte solution. The vessel may be cylindrical, cuboid, frustoconical, spherical, or some other shape. The vessel walls may comprise a material including, but not limited to, glass, quartz, polypropylene, polyvinyl chloride, polyethylene, and/or polytetrafluoroethylene. In a preferred embodiment, a vessel with a transparent window is used. For example, the window may comprise glass or quartz, though in one embodiment, a polymeric material transparent to visible light and chemically stable with the reaction mixture may be used. As defined herein, "transparent" refers to an optical quality of a compound wherein a certain wavelength or range of wavelengths of light may traverse through a portion of the compound with a small loss of light intensity. Here, the "transparent window" may causes a loss of less than 10%, preferably less than 5%, more preferably less than 2% of the intensity of a certain wavelength or range of wavelengths of light. In one embodiment, the vessel wall and window may comprise the same material, for example, a vessel may comprise quartz walls, which may also function as transparent windows. The internal cavity may have a volume of 2 mL-100 mL, preferably 2.5 mL-50 mL, more preferably 3 mL-20 mL. In another embodiment, the internal cavity may have a volume of 100 mL-50 L, preferably 1 L-20 L, more preferably 2 L-10 L. In another embodiment, for instance, for pilot plant testing, the internal cavity may have a volume of 50 L-10,000 L, preferably 70 L-1,000 L, more preferably 80 L-2,000 L. In another embodiment, the internal cavity may have a volume larger than 2,000 L. In one embodiment, one or more photoelectrochemical cells may be connected to each other in parallel and/or in series.

In another embodiment, the electrolyte solution may be in contact with more than one working electrode and/or more than one counter electrode.

In one embodiment, the counter electrode comprises platinum, gold, or carbon. In a preferred embodiment, the counter electrode comprises platinum. In one embodiment, the counter electrode may be in the form of a wire, a rod, a cylinder, a tube, a scroll, a sheet, a piece of foil, a woven mesh, a perforated sheet, or a brush. The counter electrode may be polished in order to reduce surface roughness or may be texturized with grooves, channels, divots, microstructures, or nanostructures. In at least one embodiment, where the counter electrode comprises platinum, the counter electrode is in the form of a wire. In some embodiments, the counter electrode may comprise some other electrically-conductive material such as gold, platinum-iridium alloy, iridium, titanium, titanium alloy, stainless steel, and cobalt alloy. As defined herein, an "electrically-conductive material" is a substance with an electrical resistivity of at most $10^{-6}$ $\Omega\cdot m$, preferably at most $10^{-7}$ $\Omega\cdot m$, more preferably at most $10^{-8}$ $\Omega\cdot m$ at a temperature of 20-25° C. In a preferred embodiment, the counter electrode has at least one outer surface comprising an essentially inert, electrically conducting material, such as platinum, gold, or carbon. In another preferred embodiment, the counter electrode may comprise solid platinum, gold, or carbon. The material of the counter electrode should be sufficiently inert to withstand the chemical conditions in the electrolyte solution without substantially degrading during the photoelectrochemical reaction.

In one embodiment, the electrolyte solution comprises water and an inorganic salt. The water may be tap water, distilled water, bidistilled water, deionized water, deionized distilled water, reverse osmosis water, and/or some other water. In one embodiment the water is bidistilled to eliminate trace metals. Preferably the water is bidistilled, deionized, deionized distilled, or reverse osmosis water and at 25° C. has a conductivity at less than 10 $\mu S\cdot cm^{-1}$, preferably less than 1 $\mu S\cdot cm^{-1}$, a resistivity greater than 0.1 $M\Omega\cdot cm$, preferably greater than 1 $M\Omega\cdot cm$, more preferably greater than 10 $M\Omega\cdot cm$, a total solid concentration less than 5 mg/kg, preferably less than 1 mg/kg, and a total organic carbon concentration less than 1000 µg/L, preferably less than 200 µg/L, more preferably less than 50 µg/L. Preferably the water is bidistilled, deionized, deionized distilled, or reverse osmosis water.

In one embodiment, the electrolyte solution has an inorganic salt concentration of 0.05-1 M, preferably 0.1-0.8 M, preferably 0.2-0.7 M, preferably 0.4-0.6 M, or about 0.5 M, though in some embodiments, the inorganic salt may be present at a concentration less than 0.05 M or greater than 1 M. The inorganic salt may be $Na_2SO_4$, $K_2SO_4$, $ZnSO_4$, LiCl, NaCl, KCl, $NaClO_4$, $KNO_3$, $NaNO_3$, $NH_4Cl$, $NH_4NO_3$, $LiPF_6$, $MgCl_2$, or some other inorganic salt. Preferably the inorganic salt is $Na_2SO_4$. In an alternative embodiment, an inorganic acid such as HCl, $HClO_4$, $HNO_3$, or $H_2SO_4$ may be used in addition to, or in lieu of the inorganic salt. In another alternative embodiment, an inorganic base such as LiOH, NaOH, KOH, or $NH_3$ may be may be used in addition to, or in lieu of the inorganic salt. In one or more embodiments, the electrolyte solution has a pH in a range of 5-9, preferably 6-8, more preferably a pH at about 7. In an alternative embodiment, the electrolyte solution has a pH less than 5 or greater than 9.

In one or more embodiments, the photoelectrode has a photo-current density in a range from $-0.1$ to $-100$ $\mu A/cm^2$, preferably from $-0.5$ to $-50$ $\mu A/cm^2$, preferably $-1$ to $-10$ $\mu A/cm^2$, preferably $-2$ to $-9$ $\mu A/cm^2$, preferably $-3$ to $-8$ µA/cm², preferably −4 to −7 µA/cm², preferably −5 to −6 µA/cm² when the electrodes are subjected to a potential of −0.25 to 0.05 V, preferably −0.15 to 0.03 V, more preferably −0.1 to 0.01 V under visible light irradiation. In some embodiments, the photoelectrode has a photo-current density with an absolute value greater than 100 µA/cm² when subjected to a potential with an absolute value greater than 0.25 V under visible light irradiation. In one or more embodiments, the photoelectrode has a photo-current density in a range from −0.25 to −2.5 mA/cm², preferably from −0.5 to −2.0 mA/cm², preferably from −0.75 to −1.5 mA/cm², preferably from −1.0 to −1.25 mA/cm² when the electrodes are subjected to a potential of −0.5 to −2.0 V, preferably −0.75 to −1.5 V, more preferably −1.0 to −1.2 V under visible light irradiation. In some embodiments, the photoelectrode has a photo-current density with an absolute value less than 0.25 mA/cm² when subjected to a potential with an absolute value less than 0.5 V under visible light irradiation. In an alternative embodiment, the photoelectrode has a photo-current density from −0.1 to −50 µA/cm², preferably from −0.2 to −40 µA/cm², preferably −0.3 to −30 µA/cm², preferably −0.4 to −20 µA/cm², preferably −0.5 to −10 µA/cm², preferably −0.6 to −5 µA/cm², preferably −0.8 to −2 µA/cm² when the electrodes are subjected to a potential of −0.25 to 0.05 V, preferably −0.15 to 0.03 V, more preferably −0.1 to 0.01 V under dark (without irradiation). In another alternative embodiment, the photoelectrode has a photo-current density in a range from −0.1 to −1.5 mA/cm², preferably from −0.2 to −1.0 mA/cm², preferably from −0.3 to −0.8 mA/cm², preferably from −0.4 to −0.6 mA/cm² when the electrodes are subjected to a potential of −0.5 to −2.0 V, preferably −0.75 to −1.5 V, more preferably −1.0 to −1.2 V under dark. In some embodiments, the absolute value of photo-current density of the photoelectrode under dark is at least 10% less, at least 15% less, at least 20% less, at least 25% less, at least 30% less, at least 40% less, or at least 50% less than the one of the photoelectrode under visible light irradiation.

In certain embodiments, visible light irradiation may be performed by a light source internal or external to the photoelectrochemical cell and may provide the photon energy necessary to activate the copolymer of the present disclosure in any of their embodiments as a photoelectrocatalyst. The light source may be any known light source including, but not limited to, natural solar sunlight, simulated solar light, UV light, laser light, incandescent light, and the like. Exemplary light sources include, but are not limited to, a xenon lamp such as a xenon arc lamp and a xenon flash lamp, a mercurial lamp, a metal halide lamp, an LED lamp, a solar simulator, and a halogen lamp. In certain embodiments, two or more light sources may be used. In a preferred embodiment, a simulated solar light may be used as the light source. In another preferred embodiment, natural sunlight may be used as the light source. The light may be visible light having a wavelength of 400-800 nm, preferably 420-700 nm, more preferably 450-600 nm. The light source may comprise one or more wavelengths within the range of 400-800 nm. Preferably a light source is used which emits a broad wavelength range of light and which comprises a portion or the entire visible light spectrum. A light source may additionally emit light of wavelengths below 400 nm and/or above 800 nm. In one embodiment, a filter may be used to prevent UV light from entering the reaction mixture, for example, a filter that blocks light with wavelengths less than 420 nm may be used with a simulated solar light, xenon, or a mercury gas discharge lamp. Alternatively, a light source may be used which only emits light within the visible spectrum. In an alternative embodiment, the photoelectrode may be irradiated with UV light, with or without visible light. The light source may emit a total power of 50-2000 W, preferably 100-1500 W, more preferably 500-1000 W, and may be positioned 2-30 cm, preferably 5-20 cm, more preferably 8-15 cm from the closest surface of the photoelectrode. In a preferred embodiment, the light source has an intensity of 500-4000 W/m², preferably 700-2000 W/m², more preferably 900-1500 W/m², or about 1000 W/m².

Preferably, to maintain uniform concentrations and/or temperatures of the electrolyte solution, the electrolyte solution may be agitated during the step of the subjecting. The agitating may be done intermittently or continuously. Methods of agitation include, but are not limited to, using an agitator, a stirring rod, a vortexer, a rotary shaker, a magnetic stirrer, an overhead stirrer, an ultrasonic probe, a pump, and a gas bubbler.

In one embodiment, the photoelectrochemical cell further comprises a reference electrode in contact with the electrolyte solution. A reference electrode is an electrode which has a stable and well-known electrode potential. The high stability of the electrode potential is usually reached by employing a redox system with constant (buffered or saturated) concentrations of each relevant species of the redox reaction. A reference electrode may enable a potentiostat to deliver a stable voltage to the working electrode or the counter electrode. The reference electrode may be a saturated calomel electrode (SCE), a standard hydrogen electrode (SHE), a normal hydrogen electrode (NHE), a reversible hydrogen electrode (RHE), a copper-copper(II) sulfate electrode (CSE), a silver chloride electrode (Ag/AgCl), a pH-electrode, a palladium-hydrogen electrode, a dynamic hydrogen electrode (DHE), a mercury-mercurous sulfate electrode, or some other type of electrode. In a preferred embodiment, a reference electrode is present and is a saturated calomel electrode (SCE). However, in some embodiments, the photoelectrochemical cell does not comprise a reference electrode.

In one or embodiments, the photo-current density decreases by less than 35%, preferably less than 30%, preferably less than 25%, preferably less than 20%, preferably less than 15%, preferably less than 10%, preferably less than 8%, preferably less than 6%, preferably less than 4%, preferably less than 2%, preferably less than 1% after subjecting the photoelectrode to a potential of −0.25 to 0.05 V, preferably −0.15 to 0.03 V, more preferably −0.1 to 0.01 V under visible light irradiation for about 1-9 hours, about 2-8 hours, about 3-7 hours, or about 4-6 hours.

According to a fifth aspect, the present disclosure relates to a method of forming hydrogen gas. The method involves subjecting the electrodes of the photoelectrochemical cell of the forth aspect to a potential of −2.0 to 0.05 V, preferably −1.75 to 0 V, preferably −1.5 to −0.25 V, preferably −1.25 to −0.5 V, preferably −1 to −0.75 V, and concurrently irradiating the photoelectrochemical cell with visible light, thereby forming hydrogen gas. Here, "the electrodes" refers to the photoelectrode comprising the copolymer and the counter electrode. In some embodiments, the electrodes are subjected to a potential with an absolute value greater than 2.0 V.

Photoelectrochemical water splitting dissociates water into its constituent parts, hydrogen ($H_2$) and oxygen ($O_2$), by applying a potential to a photoelectrochemical cell (PEC) under either artificial or natural light. The process generally involve the photoelectrocatalyst absorbing a photon with sufficient energy (above 1.23 eV, $\lambda < \sim 1000$ nm), subsequently permitting photoexcited electrons and holes to separate and migrate to the surface of the photoelectrocatalyst material, reducing adsorbed species (i.e. water). Two types of photochemical systems operate via photocatalysis. One uses semiconductor surfaces as catalysts. In these devices the semiconductor surface absorbs solar energy and acts as an electrode for water splitting. The other methodology uses in-solution metal complexes as catalysts.

Preferably the counter electrode functions as the photocathode, receiving a negative potential to reduce water into $H_2$ gas and $OH^-$, while the photoelectrode comprising the copolymer functions as the photoanode, receiving a positive potential to oxidize $OH^-$ into $O_2$ gas and $H_2O$. This is summarized by the following reactions:

Photocathode (reduction): $2H_2O_{(l)} + 2e^- \rightarrow H_{2(g)} + 2OH^-_{(aq)}$ Photoanode (oxidation): $4OH^-_{(aq)} \rightarrow O_{2(g)} + 2H_2O_{(l)} + 4e^-$ Overall reaction: $2H_2O_{(l)} \rightarrow 2H_{2(g)} + O_{2(g)}$ In another embodiment, the potentials may be switched, wherein the counter electrode functions as the photoanode and receives a positive potential, and the photoelectrode comprising the copolymer functions as the photocathode and receives a negative potential. In an alternative embodiment, the electrodes may be subjected to an alternating current (AC) in which the photoanode and photocathode roles are continually switched between the two electrodes.

In one embodiment, an amount of the copolymer on the photoelectrode in the photoelectrochemical cell is in a range of 0.01-10 g/L, 0.05-9 g/L, 0.1-8 g/L, 0.2-7 g/L, 0.3-6 g/L, 0.4-5 g/L, 0.5-4 g/L, 0.6-3 g/L, 0.7-2 g/L, or 0.8-1 g/L. The hydrogen gas is produced at a rate in a range of 10-500 μmol/h per gram of the copolymer, at least 20 μmol/h per gram, at least 40 μmol/h per gram, at least 60 μmol/h per gram, at least 80 μmol/h per gram, at least 100 μmol/h per gram, up to 150 μmol/h per gram, up to 200 μmol/h per gram, up to 250 μmol/h per gram, up to 300 μmol/h per gram, up to 350 μmol/h per gram, up to 400 μmol/h per gram, up to 450 μmol/h per gram, up to 500 μmol/h per gram of the copolymer.

In one embodiment, the method further comprises a step of collecting $H_2$-enriched gas. In one embodiment, the space above each electrode may be confined to a vessel in order to receive or store the evolved gases from one or both electrodes. The collected gas may be further processed, filtered, or compressed. Preferably the $H_2$-enriched gas is collected above the photocathode. In one embodiment, the $H_2$-enriched gas is not 100 vol % $H_2$. For example, the enriched gas may also comprise $N_2$ from air, and water vapor and other dissolved gases from the electrolyte solution. The $H_2$-enriched gas may also comprise $O_2$ from air. The $H_2$-enriched gas may comprise greater than 20 vol % $H_2$, preferably greater than 40 vol % $H_2$, more preferably greater than 60 vol % $H_2$, even more preferably greater than 80 vol % $H_2$, relative to a total volume of the receptacle collecting the evolved $H_2$ gas. In some embodiments, the evolved $H_2$ gas may be bubbled into a vessel comprising water or some other liquid, and a higher concentration of $H_2$ may be collected.

In an alternative embodiment, the photoelectrode may be used as a photocatalyst for hydrogen gas production reactions under light or dark. In another alternative embodiment, the copolymer described herein may be used alone as a photocatalyst for hydrogen gas production reactions under light or dark. In some embodiments, the copolymer may be used in the field of batteries, fuel cell electrodes, organic semiconductor in optical devices, organic photovoltaics (OPV), organic field effect transistors (OFET), liquid crystal display (LCD), and/or organic light emitting diodes (OLEDs).

The examples below are intended to further illustrate protocols for preparing, characterizing the copolymer, photoelectrode and photoelectrochemical cell, and uses thereof, and are not intended to limit the scope of the claims.

Example 1

Synthesis of 4,4'-(9-(2-ethylhexyl)-9H-carbazole-3,6-diyl) dibenzaldehyde (4)

Toluene (3 mL) was added to a suspension of carbazole 2 (0.30 g, 0.69 mmol), boronic ester 3 (0.40 g, 1.7 mmol), tetrabutylammonium bromide (0.44 g, 1.36 mmol) and $Na_2CO_3$ (0.28 g, 2.64 mmol) in deionized water (4 mL). The nitrogen gas was bubbled through the reaction mixture gently for 3 minutes followed by the addition of [PdCl$_2$(dppf)] (0.082 g, 0.1 mmole). The mixture was then heated for 12 hours at 45° C. After cooling to room temperature, the reaction was filtered through a pad of celite and the filtrate was washed with ethyl acetate (20 mL). The filtrate was transferred into a separatory funnel and washed with water (10 mL). The organic layer was separated and washed with brine (10 mL), dried over $Na_2SO_4$ and evaporated under reduced pressure. The crude product (a dark yellow oily material) was purified by column chromatography (ethyl acetate/hexane 15:85) to give the title compound 4 as a light yellow solid (0.27 g, 80%). $^1$H-NMR (500 MHz, CDCl$_3$): δ 0.86 (3H, t, J=7.0 Hz, CH$_3$), 0.94 (3H, t, J=7.3 Hz, CH$_3$), 1.28-1.41 (8H, m, Aliphatic-H), 2.04 (1H, m, Aliphatic-H), 4.25 (2H, dd, J=4.5, 7.9 Hz, NCH$_2$), 7.51 (2H, d, J=8.5 Hz, Ar—H), 7.79 (2H, dd, J=1.8, 8.3 Hz, Ar—H), 7.90 (4H, d, J=8.3 Hz, Ar—H), 7.98-8.00 (4H, m, Ar—H), 7.51 (2H, d, J=1.8 Hz, Ar—H), 10.07 (1H, s, CHO), 10.09 (1H, s, CHO).

Example 2

Synthesis of P1

Sodium tert-butoxide (0.20 g, 2.12 mmol) was added to a solution of dialdehyde 4 (0.20 g, 0.42 mmol) and diphosphonate 5 (0.31 g, 0.42 mmol) in anhydrous DMF (20 mL) under nitrogen atmosphere. The mixture was then stirred for 24 h at 100° C. The reaction was cooled to room temperature, poured over 100 mL of methanol and then centrifuged. The solvent was decanted and the residue was re-dissolved in THF and successively re-precipitated from methanol, isopropanol, and hexane to get the final product as a brownish red solid (0.21 g, 53%). $^1$H-NMR (500 MHz, CDCl$_3$): δ 0.84-0.96 (m, 12H), 1.20-1.43 (m, 40H), 1.58 (bs, 4H), 1.92 (bs, 4H), 2.12 (bs, 1H), 4.10 (bs, 4H), 4.22 (bs, 2H), 7.19 (bs, 2H), 7.48-776 (m, 14H), 8.41 (bs, 2H).

Example 3

Synthesis of P2

P2 was synthesized following the same procedure adopted for the synthesis of P1 using monomers 4 and 6 to afford P2 as a light yellow solid (0.24 g, 55%). $^1$H-NMR (500 MHz, CDCl$_3$): δ 0.90-1.04 (m, 18H), 1.41-1.86 (m, 27H), 2.12 (bs, 1H), 4.01 (bs, 4H), 4.22 (bs, 2H), 7.19 (bs, 2H), 7.46-7.76 (m, 14H), 8.42 (bs, 2H).

Example 4

Synthesis and Characterization

Figure 10A:
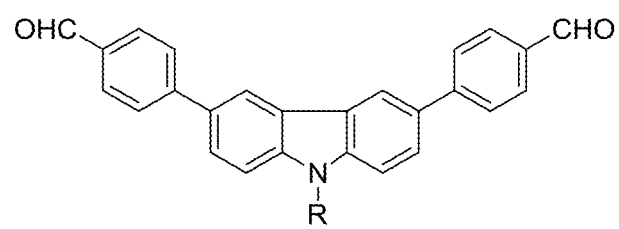
FIG. 10A shows the chemical structure of a dialdehyde monomer 4.
Figure 10B:
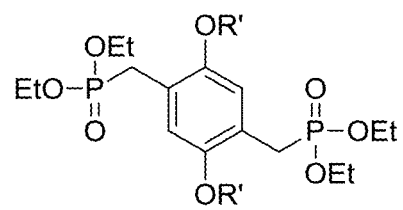
FIG. 10B shows the chemical structure of a diphosphonate monomer 5.
Figure 10C:
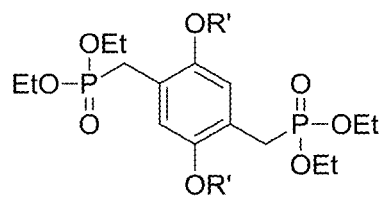
FIG. 10C shows the chemical structure of a diphosphonate monomer 6.

The synthesis of monomer 4 was required for the synthesis of P1 and P2, which was outlined in FIG. 1. The N-alkylation of carbazole 1 with 2-ethyl hexylbromide produced the intermediate 2 [33], which was then reacted with boronic ester 3 [Oehlke A, Auer A A, Jahre I, Walfort B, Riiffer T, Zoufala P, et al. Nitro-substituted stilbeneboronate pinacol esters and their fluoro-adducts. Fluoride ion induced polarity enhancement of arylboronate esters. J Org Chem 2007; 72:4328-39, incorporated herein by reference in its entirety] under Suzuki-Miyaura conditions to generate monomer 4 (FIG. 10A) in a yield of 80%. The synthesis of diphosphonates 5 (FIG. 10B) and 6 (FIG. 10C), on the other hand, were achieved using hydroquinone by employing known procedures (FIG. 1).

The reaction of monomer 4 with monomers 5 or 6 under Horner-Emmons reaction conditions led to copolymers P1 or P2 with an excellent E-olefin stereochemistry. The polymerization was accomplished by slow addition of t-BuONa (5 equiv) to a solution of monomers 4 with 5 or 6 in DMF followed by stirring the mixture for 24 hours at 100° C. The reaction was quenched by aqueous ammonium chloride, then poured into excess methanol, and centrifuged, which was followed by successive reprecipitation in methanol, isopropanol, and hexane to produce P1 and P2 in moderate yields (FIG. 1). Both polymers were soluble in common organic solvents such as chloroform, methylene chloride and tetrahydrofuran.

Figure 11:
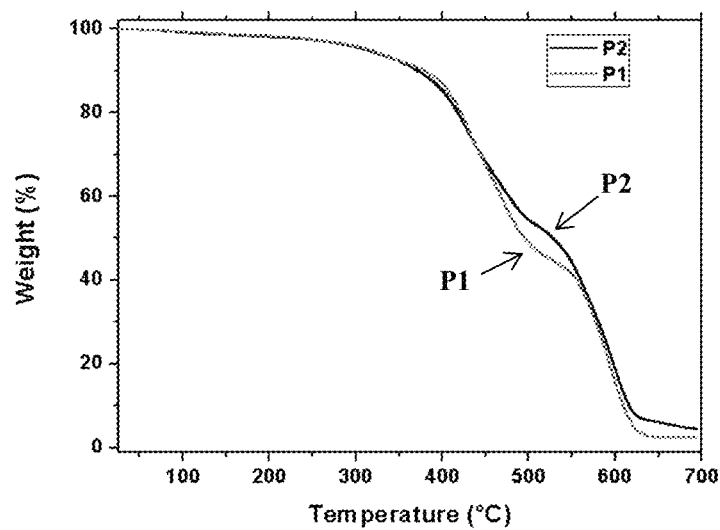
FIG. 11 is an overlay of thermal gravimetric analysis (TGA) thermograms of copolymers P1 and P2.

The structures of these polymers were confirmed by $^1$H-NMR and IR spectra. The characteristic aldehyde peaks at 2866, 2733, and 1691 cm$^1$ present in the IR spectrum of monomer 4 were absent in the IR spectra of polymers P1 and P2. In addition, the end groups of phosphonate monomers 5 and 6 disappeared in the $^1$H-NMR spectra of polymers. Moreover, the $^1$H-NMR of P1 in CDCl$_3$ showed broadened peaks for —NCH$_2$— and —OCH$_2$— groups at δ of 4.22 and 4.10 ppm, respectively. Peaks for —OCH$_2$CH$_2$—, —OCH$_2$CH$_2$CH$_2$—, and a methine proton of N-alkyl chain at δ of 1.92, 1.58 and 2.12 ppm, respectively were observed in the spectrum. Furthermore, resonances for terminal methyl groups of alkoxy and N-alkyl side chains appeared at δ of 0.96-0.84 ppm whereas other protons signals of alkoxy and N-alkyl side chains appeared at δ of 1.43-1.26 ppm. Peaks for carbazole ring protons (4,5-positions) appeared more downfield at δ of 8.41 ppm. Similarly, $^1$H-NMR data were consistent with the proposed structure of the P2. Gel permeation chromatography (GPC) using polystyrene as a standard and THF as the mobile phase was implemented to determine number-average molecular weights, which were summarized in the experimental section. The thermal properties of copolymers were evaluated by thermogravimetric analysis (TGA) under oxygen atmosphere at a heating rate of 10° C. min$^{-1}$ (FIG. 11). Both polymers were found to be stable even at high temperatures and no appreciable mass loss was observed at temperatures up to 300° C. The thermal decomposition temperature (T$_d$) of these polymers was 350° C., determined by an abrupt weight loss at temperatures above T$_d$, indicating decomposition of the backbone of the polymers. The assessment of morphology of copolymers was performed by SEM analysis (FIGS. 2A-B and 3A-B). The SEM images revealed that P1 and P2 have well defined average microspheres with an average diameter of 7 and 2 μm, respectively. It has been well established that conjugated polymers tend to form microspheres through their amorphous aggregation [Álvarez-Diaz A, Salinas-Castillo A, Camprubi-Robles M, Costa-Fernández J M, Pereiro R, Mallavia R, et al. Conjugated Polymer Microspheres for "Turn-Off"/"Turn-On" Fluorescence Optosensing of Inorganic Ions in Aqueous Media. Anal Chem 2011; 83:2712-8, incorporated herein by reference in its entirety]. The size of microspheres depends mainly on the average number molecular weight of the polymer (M$_n$). For example, polymers with a higher M$_n$ generally yield smaller microspheres [Kushida S, Braam D, Dao T D, Saito H, Shibasaki K, Ishii S, et al. Conjugated Polymer Blend Microspheres for Efficient, Long-Range Light Energy Transfer. ACS Nano 2016; 10:5543-9, incorporated herein by reference in its entirety]. Moreover, the micrographs also demonstrated that P2 has a larger surface area than P1 (FIGS. 2A-B and 3A-B).

Example 5

Photophysical Properties

Figure 4A:
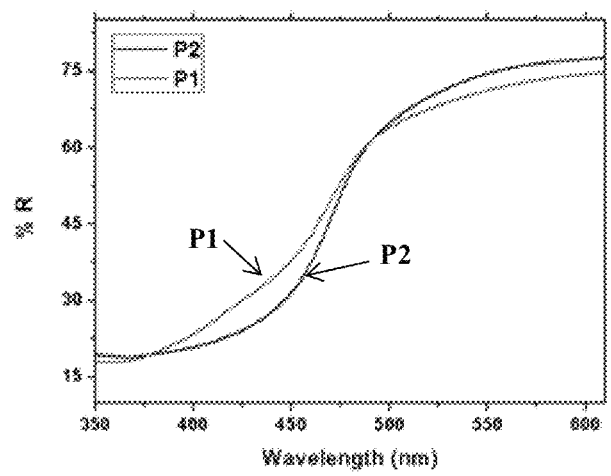
FIG. 4A is an overlay of ultraviolet-visible (UV-vis) reflectance spectra of P1 and P2 copolymers deposited over fluorine doped tin oxide (FTO) substrate.
Figure 4B:
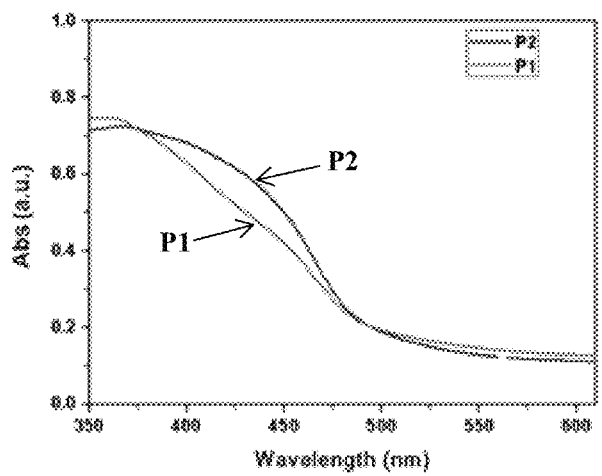
FIG. 4B is an overlay of UV-vis absorption spectra of P1 and P2 copolymers deposited over FTO substrate.

The polymers layers were deposited over a fluorine-doped tin oxide (FTO) conducting substrate by dip deposition technique. The FTO substrate (FTOs) was dipped in a solution of polymer in THF at concentration of 10 mg/2.5 mL for 15 minutes followed by gentle removal of electrodes from the solution and placing them over a hot plate for 1 hr at 80° C. The resultant yellowish thin films were used for DR-UV-vis spectrometric measurements to obtain % R vs nm and eV vs F(R) spectra. The optical band gaps of the polymers were determined by the onset of UV-vis absorption spectra of polymers thin films. The band gaps of P1 and P2 were determined by the onset absorption edge at 580 and 590 nm (FIG. 4A), corresponding to the band gaps of 2.14 and 2.10 eV, respectively (Table 1). The onset absorptions of P1 and P2 at 554 and 566 nm (FIG. 4B) corresponded to optical band gaps of 2.24 and 2.19 eV, respectively (Table 1).

TABLE 1

| | Bandgap measurements of P1 and P2 by DR-UV-vis spectrophotometry | | | | | |
|---|---|---|---|---|---|---|
| | eV vs F(R) | | KM Vs nm | | % R Vs nm Absorption | |
| Polymers | Indirect band-gap | Direct band-gap | On set Wave-length | Band-gap | edge Wave-length | Band-gap |
| P1 | 2.41 eV | 2.74 eV | 554 nm | 2.24 eV | 580 nm | 2.14 eV |
| P2 | 2.38 eV | 2.51 eV | 566 nm | 2.19 eV | 590 nm | 2.10 eV |

Figure 12A:
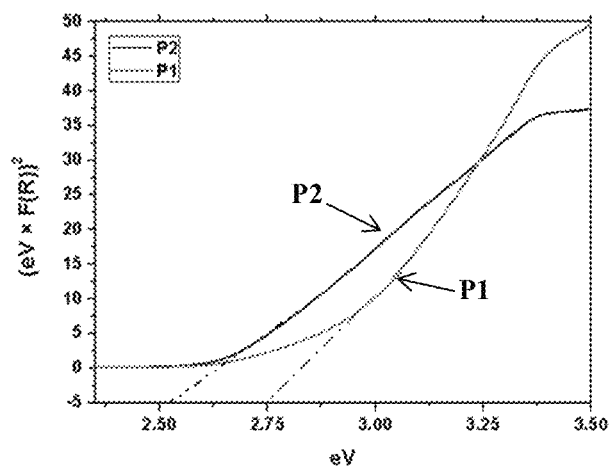
FIG. 12A shows direct bandgaps of P1 and P2 copolymers deposited over FTO substrate.
Figure 12B:
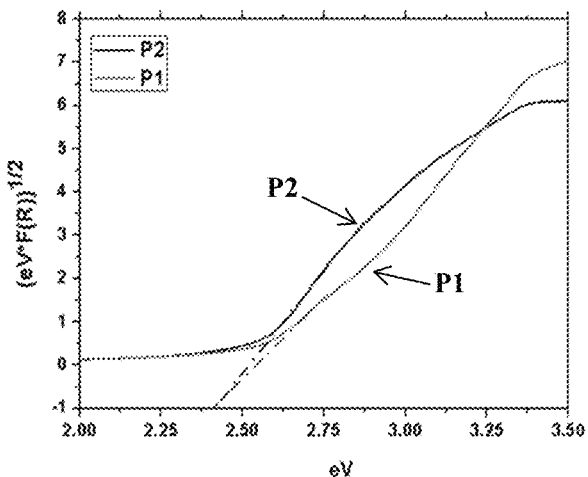
FIG. 12B shows indirect bandgaps of P1 and P2 copolymers deposited over FTO substrate.

The observed low band gaps of P1 and P2 could be attributed to the strong intramolecular charge transfer (ICT) between electron donor segments such as carbazole and dialkoxybenzene and strong electron acceptor moieties such as a phenylvinylene spacer. Moreover, as outlined in FIGS. 12A and 12B, direct and indirect bandgaps of polymers were also measured.

Figure 5:
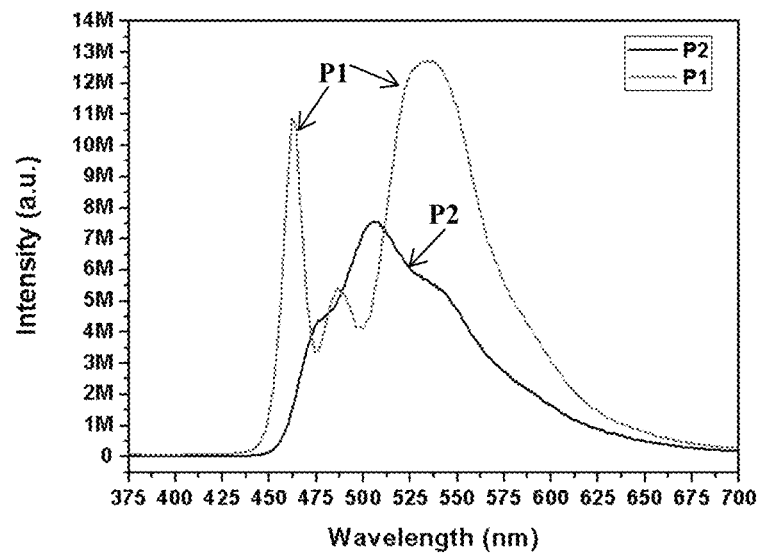
FIG. 5 is an overlay of fluorescence emission spectra of P1 and P2 copolymers in tetrahydrofuran (THF) upon excitation at 390 nm.

The enhanced efficiency of photo-excited charge separation was verified by photoluminescence (PL) spectroscopy. PL emission spectra of polymers in THF solution were recorded with an excitation wavelength at 390 nm (FIG. 5). P1 showed an emission peak with maxima at 535 nm which had higher intensity than the emission of P2 with maxima at 542 nm. As a result, a bathochromic shift of 7 nm was observed by going from P1 to P2. The drastic quenching of the emission intensity in P2 suggested that its recombination of charges was effectively suppressed [Xu R, Li H, Zhang W, Yang Z, Liu G, Xu Z, et al. The fabrication of $In_2O_3/In_2S_3/$ Ag nanocubes for efficient photoelectrochemical water splitting. Phys Chem Chem Phys 2016; 18:2710-7, incorporated herein by reference in its entirety].

Example 6

Computational Study

Figure 13A:
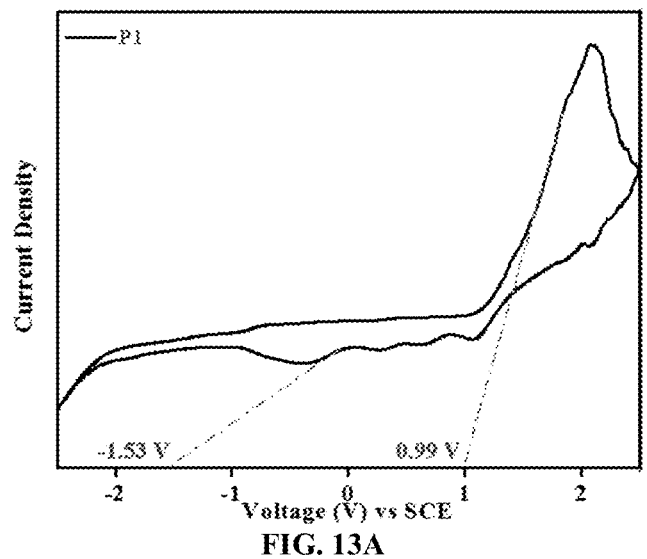
FIG. 13A is a cyclic voltammogram of copolymer P1.
Figure 13B:
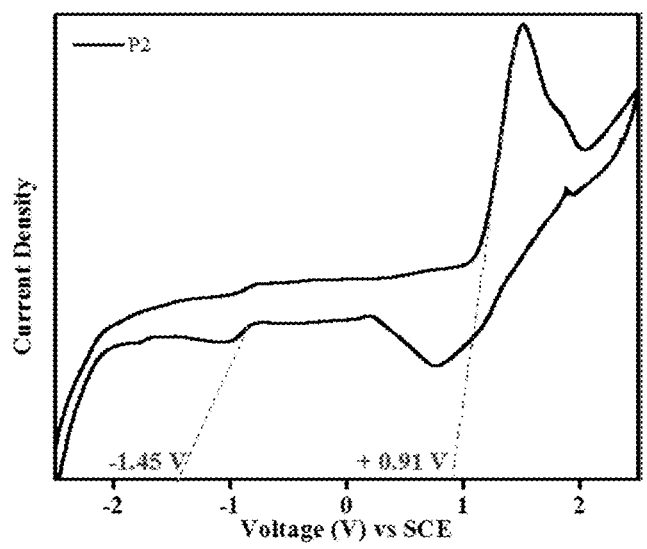
FIG. 13B is a cyclic voltammogram of copolymer P2.
Figure 14A:
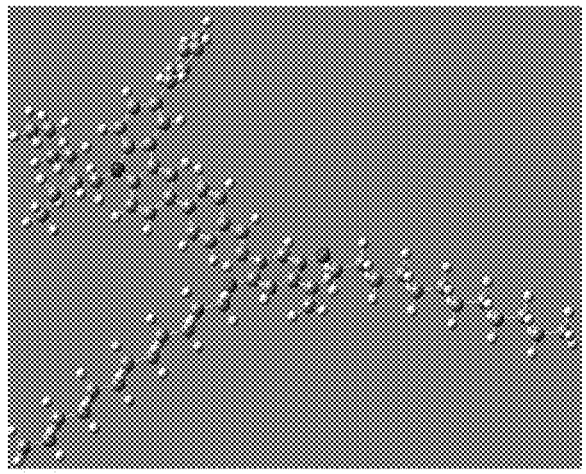
FIG. 14A shows the optimized structure of copolymer P1 repeating units.
Figure 14B:
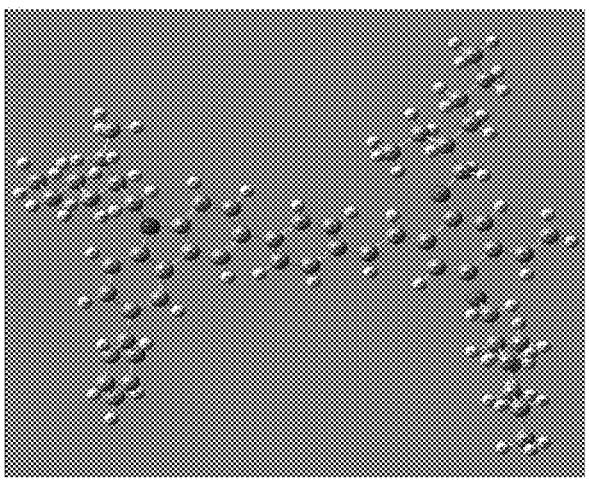
FIG. 14B shows the optimized structure of copolymer P2 repeating units.

The geometries of both polymers were optimized using gauss view 5.0 and Gaussian 09 software package (FIGS. 14A and 14B) [M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Had and DJF. GAUSSIAN 09, Revision B.01. Gaussian, Inc, Wallingford Conn. 2010, incorporated herein by reference in its entirety]. Density functional theory (DFT) calculations were performed with B3LYP methods. The optimized structures were used to calculate the bandgaps of P1 and P2 to be 2.57 and 2.41 eV, respectively (Table 2). These theoretical band gap values were comparable to the experimental values, which were determined by cyclic voltammetry (CV) and DR-UV-vis methods. The cyclic voltammogram of P1 (FIG. 13A) revealed the oxidation onset intercepts at $E_{ox}$=0.99 V whereas the reduction onset intercept was observed at $E_{red}$=−1.53 V. These values were incorporated into CV based Bredas equation ($E_{HOMO}$=[($E_{ox}-E_{ferrocene}$)+4.8] eV and $E_{LUMO}$=[($E_{red}-E_{ferrocene}$)+4.8] eV) for P1 to deduce HOMO and LUMO values as 5.36 and 2.84 eV, respectively [Ashkan Shafiee muhamad M S and M Y. Determination of HOMO and LUMO of [6,6]-Phenyl C61-butyric Acid3-ethylthiophene Ester and Poly (3-octyl-thiophene-2, 5-diyl) through Voltametry Characterization. Sains Malaysiana 2011; 40:173-176, incorporated herein by reference in its entirety]. Likewise, HOMO and LUMO values of P2 were found to be 5.28 and 2.92 eV, respectively (FIG. 13B).

TABLE 2

Bandgap measurement by CV and computational methods

| Polymer | CV | | | B3LYP/6-311* |
|---|---|---|---|---|
| | HOMO ($E_H$) | LUMO ($E_L$) | $E_g = E_{H-} E_L$ | |
| P1 | 5.36 | 2.84 | 2.52 eV | 2.57 eV |
| P2 | 5.28 | 2.92 | 2.36 eV | 2.41 eV |

Example 7

CA Measurements

A standard three electrode photocell system supported by an artificial solar simulator (OrielSol-3A) which was calibrated with a silicon diode to 1 SUN power (100 mW cm$^{-2}$) and a potentiostat (AutoLab) was used for photoelectrochemical (PEC) measurements. The FTOs was dipped in a solution of polymer in THF at a concentration of 10 mg/2.5 mL for 15 minutes followed by gentle removal and heating them over hot plate for 1 hr at 80° C. The resultant firmed yellowish thin films (polymer-FTO) were used for CA measurements. The polymer-FTO (photoanodes) was served as the working electrode, a platinum (Pt) wire and standard calomel electrode (SCE) were used as an auxiliary and reference electrode, respectively. All these electrodes were immersed in a solution of 0.5 M $Na_2SO_4$ (pH 7.0), which was served as an electrolyte. To measure a photo-current in a deoxygenated solution, argon was bubbled through the electrolyte for 5 minutes to remove oxygen from the solution prior to measurement. A gentle flow of argon was then maintained during the course of photo-current measurements. The solar simulator was fitted with a UV light filter (UV cut off filter<420 nm) to assess visible light induced PEC water splitting performance of polymers.

Figure 6:
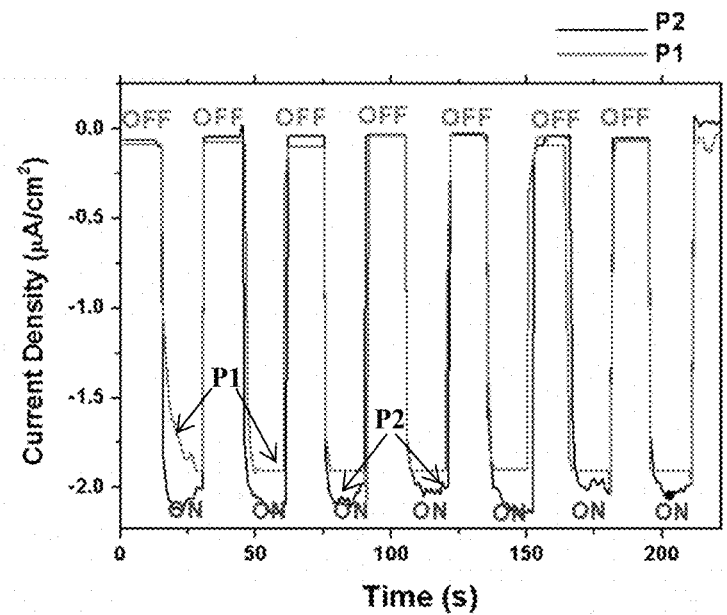
FIG. 6 is an overlay of chronoamperometric measurements of P1 and P2 copolymers deposited over FTO substrate, in which photocurrent densities were recorded at 0 V vs. saturated calomel electrode (SCE) bias in a standard three electrode system under dark ("OFF") and simulated solar light (1 Sun) ("ON").

In CA measurements, the photocurrent response by polymer-FTOs was studied at zero open circuit potential (OCP) ~0 V while maintaining the on/off illumination with regular intervals of time (~15 sec). In stacked CA measurements, photo-current density is plotted as function of time, which revealed that the photo-current density generated by copolymer P1-FTO and copolymer P2-FTO at 0 V was −1.8 and −2.1 μA/cm$^2$, respectively (FIG. 6). The negative current densities suggested that hydrogen evolution reaction (HER) was the dominant process in the water splitting at bias 0 V vs SCE [Cummins D R, Martinez U, Sherehiy A, Kappera R, Martinez-Garcia A, Schulze R K, et al. Efficient hydrogen evolution in transition metal dichalcogenides via a simple one-step hydrazine reaction. Nat Commun 2016; 7:11857, incorporated herein by reference in its entirety]. Furthermore, shifting of the $J_p$–t photocurrents to its normal baseline under dark (no illumination) suggested a reversible response. These observations also confirmed that the photocurrent generation by copolymer-FTOs was exclusively due to solar driven water splitting reaction.

Figure 15:
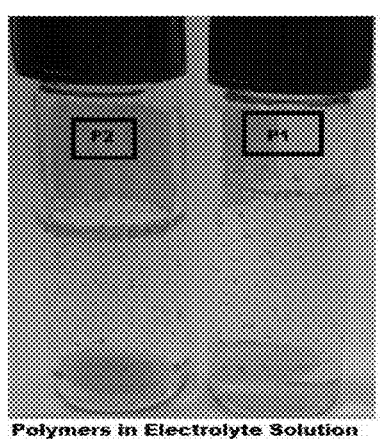
FIG. 15 is a photograph of copolymers P1 and P2 suspended in 0.5 M $Na_2SO_4$ solution taken 20 min after stirring stopped.
Figure 16A:
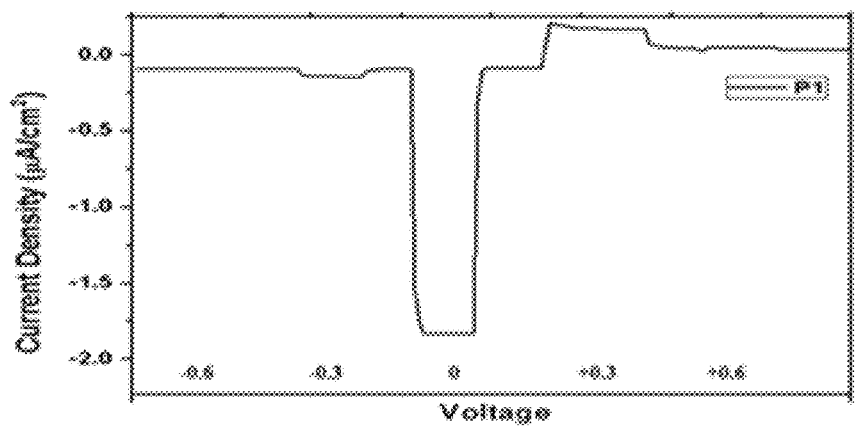
FIG. 16A shows photo-current density of P1 during water splitting under different potentials.
Figure 16B:
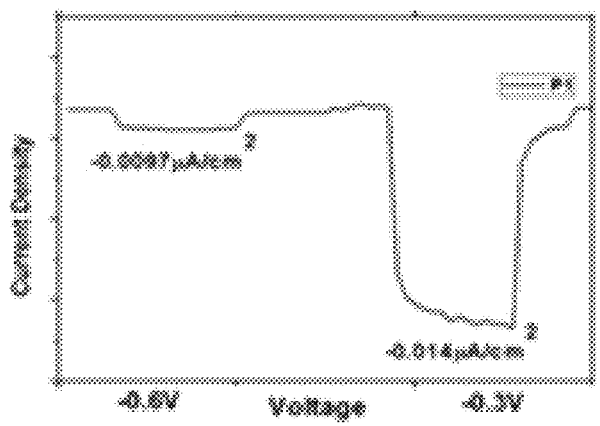
FIG. 16B is an expanded view of FIG. 16A under potential between −0.3 V and −0.6 V.
Figure 16C:
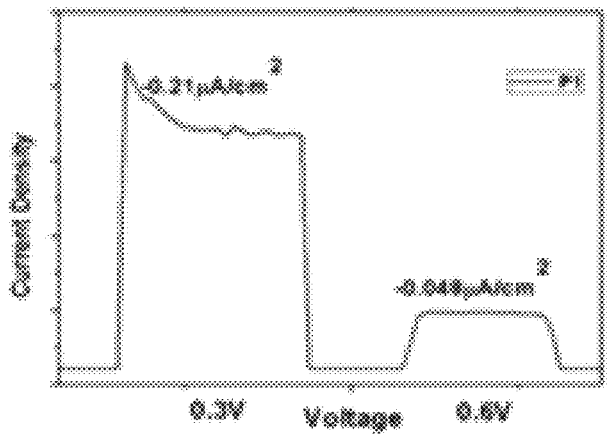
FIG. 16C is another expanded view of FIG. 16A under potential between 0.3 V and 0.6 V.
Figure 17A:
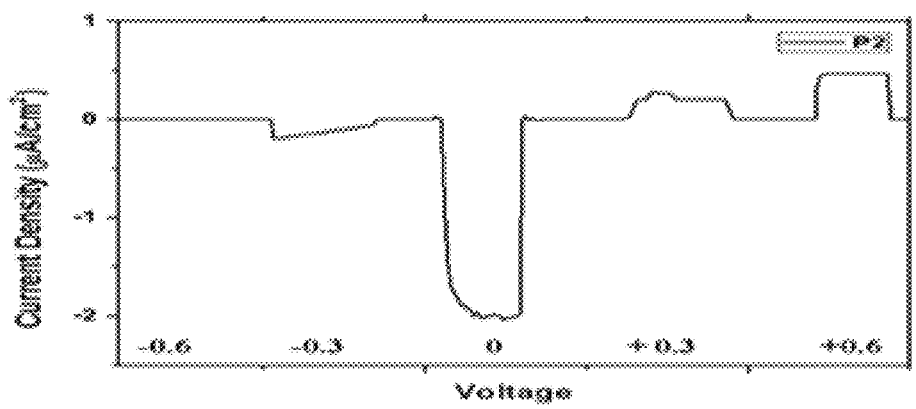
FIG. 17A shows photo-current density of P2 during water splitting under different potentials.
Figure 17B:
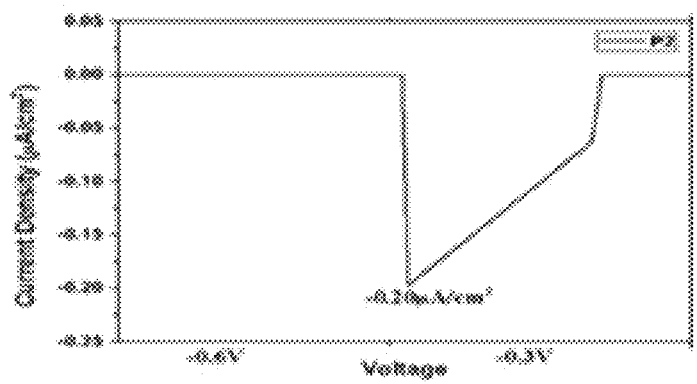
FIG. 17B is an expanded view of FIG. 16A under potential between −0.3 V and −0.6 V.
Figure 17C:
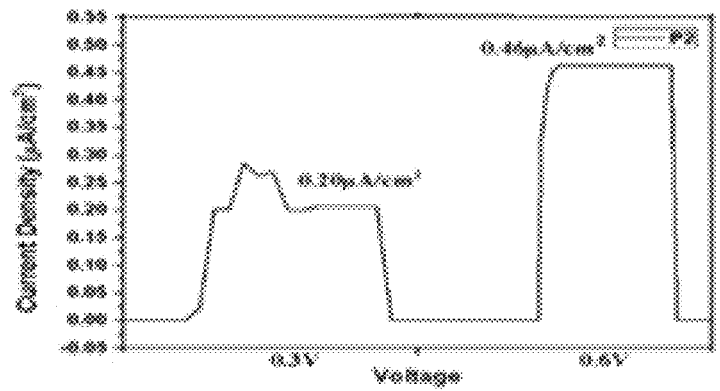
FIG. 17C is another expanded view of FIG. 16A under potential between 0.3 V and 0.6 V.

The enhanced PEC performance of P2 is attributed to its narrow band gap, which in turn improves light harvesting ability to produce sufficient charge carriers and a larger surface area, as shown in SEM analysis (FIGS. 2A-B and 3A-B), which helps minimizing the charge recombination and holding longer transportation pathway for photo-generated excitons [Li L, Lo W, Cai Z, Zhang N, Yu L. Donor-Acceptor Porous Conjugated Polymers for Photocatalytic Hydrogen Production: The Importance of Acceptor Comonomer. Macromolecules 2016; 49:6903-9, incorporated herein by reference in its entirety]. Moreover, the drastic quenching of the PL emission intensity of P2 suggested that the recombination of charges was effectively suppressed in P2 (FIG. 5), which was in excellent agreement with our experimental observations. It is known that introduction of large specific surface area in graphitic carbon nitride (g-$C_3N_4$) polymers lead to fluorescence quenching [Wang X, Blechert S, Antonietti M. Polymeric Graphitic Carbon Nitride for Heterogeneous Photocatalysis. ACS Catal 2012; 2:1596-606, incorporated herein by reference in its entirety]. Moreover, the enhanced PEC performance of P2 agrees with the report of Zou et al., which revealed that an increase in particle size of the copolymer would result in a higher probability of charge carrier recombination. In addition, a decrease in specific surface area of the copolymer would lead to less available surface sites for the photocatalytic reaction. In another study, a large surface area and optimized charge separation in g-$C_3N_4$ polymers has been linked to an improved $H_2$ production from the photochemical reduction of water [Wang X C, Maeda K, Chen X F, Takanabe K, Domen K, Hou Y D, et al. Polymer Semiconductors for Artificial Photosynthesis: Hydrogen Evolution by Mesoporous Graphitic Carbon Nitride with Visible Light. J Am Chem Soc 2009; 131:1680-1, incorporated herein by reference in its entirety]. Similarly, a comparative study of TiC/TiO$_2$NShts/Ti, TiC/TiO$_2$NTbs/Ti and TiC/TiO$_2$NWrs/Ti based photoelectrodes (NShts=nanosheets; NTbs=nanotubes and NWrs=nanowires) has been reported [Sofiane S, Bilel M. Effect of specific surface area on photoelectrochemical properties of TiO$_2$ nanotubes, nanosheets and nanowires coated with TiC thin films. J Photochem Photobiol A Chem 2016; 324:126-33, incorporated herein by reference in its entirety], which indicated that TiC/TiO$_2$NWrs/Ti exhibited enhanced PEC performance for HER. The high performance of TiC/TiO$_2$NWrs/Ti was resulted from a high specific surface area of TiO$_2$NWrs, which provided a large number of adsorption sites. The impact of high surface area of organic semiconductors on enhancing PEC performance to produce H$_2$ from water has been delineated and reviewed [Zhang, G, Lan Z.-A, Wang X. Conjugated Polymers: Catalysts for Photocatalytic Hydrogen Evolution. Angew Chem Int Ed 2016; 55:15712-15727, incorporated herein by reference in its entirety]. However, it is noteworthy that in most of the previous studies, HER by organic semiconductors necessitated the use of cocatalysts such as Pt and Ru or the use of sacrificial agents including diethylamine, triethanolamine, methanol, ethanol and mixture of methanol and triethylamine or diethylamine. PBTh film based electrode has been used under aqueous conditions at neutral pH for the HER without the use of cocatalysts or sacrificial agent. However, the amount of H$_2$ produced was only at the detectable level, together with the generation of a small amount of current. Results disclosed herein are significant for a cocatalyst and sacrificial agent free HER under aqueous conditions at neutral pH, which generates an appreciable amount of photo-current density. The electrolyte (0.5 M Na$_2$SO$_4$ solution) wettability of P1 and P2 revealed that these copolymers were almost equally suspended in the electrolyte solution (FIG. 15). Both the nitrogen atom on carbazole and oxygens of alkoxy moiety could act as hydrogen bond acceptors and may involve in hydrogen-bond interactions with water to attain a certain degree of wetting. On the other hand, the nature of alkyl side chain (dodecyl or 2-EtHex) of alkoxy groups on the phenyl ring does not play a significant role in the electrolyte wettability of P1 and P2. The influence of wettability on the relative PEC performance of these copolymers does not seem to be significant [Schulze M, Kunz V, Frischmann P D, Wurthner F. A. Supramolecular Ruthenium Macrocycle with High Catalytic Activity for Water Oxidation that Mechanistically Mimics Photosystem II. Nat. Chem 2016; 8:576-83, incorporated herein by reference in its entirety].

Figure 18:
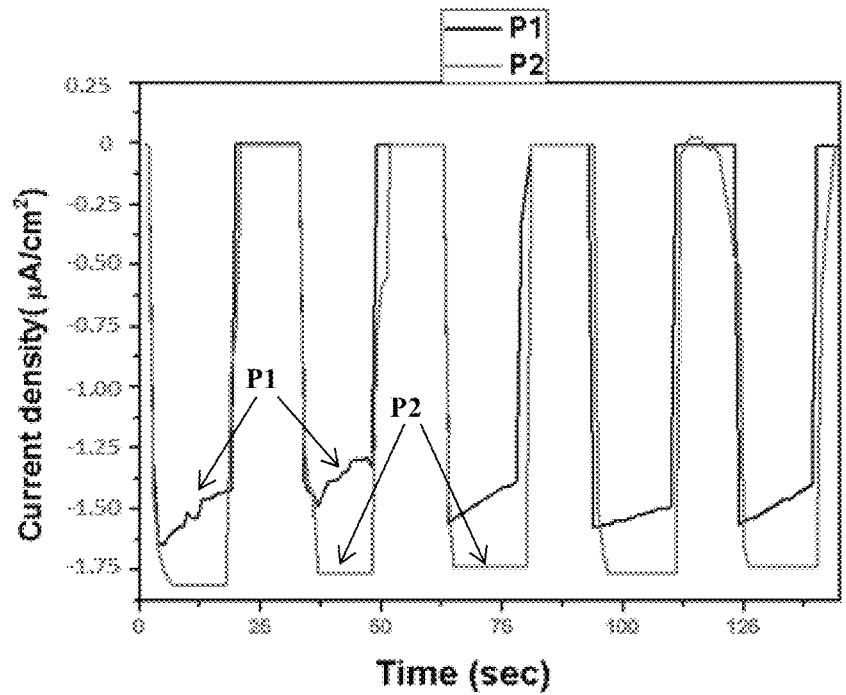
FIG. 18 is an overlay of chronoamperometric measurements of P1 and P2 copolymers deposited over FTO substrate in deoxygenated electrolyte solution, in which photocurrent densities were recorded at −0.3 V vs. saturated calomel electrode (SCE) bias in a standard three electrode system under dark and simulated solar light (1 Sun).
Figure 19:
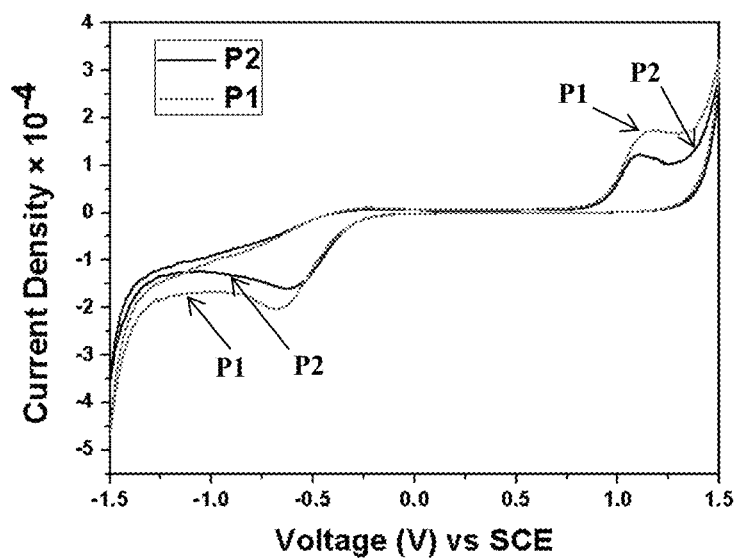
FIG. 19 is an overlay of cyclic voltammograms of copolymers P1 and P2 under simulated solar light (1 Sun).

The oxygen evolution reaction and the effect of dissolved oxygen content on the generation of photo-current by P1 and P2 was also studied. These copolymers evolved oxygen as a dominant reaction at positive applied potential where the photo-current density was first increased at +0.3 V and then decreased at +0.6 V (FIGS. 16A-C and 17A-C). To measure the photo-current in the deoxygenated solution, argon was bubbled through the electrolyte to remove oxygen from the solution. In an argon-purged solution, both copolymers at positive applied potential did not produce any significant photo-current compared to that generated by the oxygenated solution at 0 V, as illustrated in FIG. 4. However, upon irradiation of 1 Sun solar light at applied voltage −0.3 V, a significant enhancement in the photo-current density was observed (FIG. 18). Thus, a bias voltage of −0.3 V was needed to generate similar amount of photo-current from the deoxygenated solution, which was produced by the oxygenated solution at 0 V. The impact of electrochemical oxidation or reduction on P1 and P2 was examined by CV analysis under irradiation of 1 Sun solar light. The CV results indicated the oxidation and reduction peaks at +0.75 V and −0.4 V, respectively (FIG. 19). These potential values are far away from the applied potential at 0 V used to study PEC performance of P1 and P2. This suggested that photo-current generation by P1 and P2 in both oxygenated and deoxygenated solutions was due to water splitting reaction.

Figure 7:
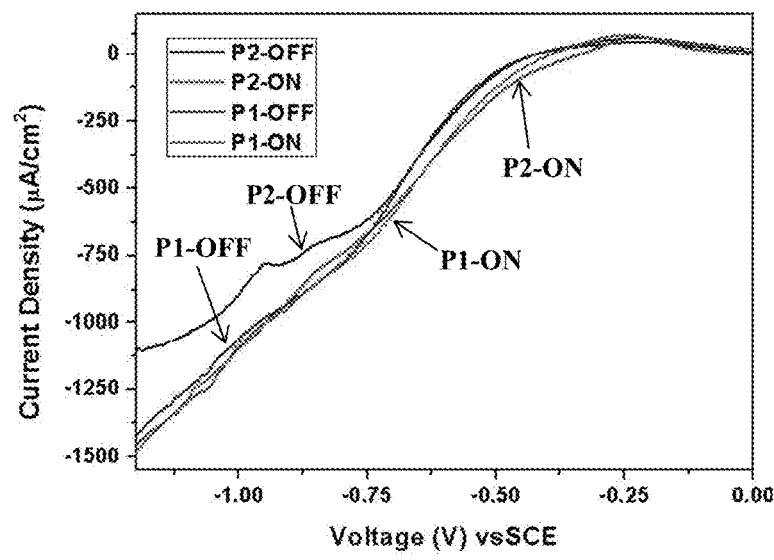
FIG. 7 is an overlay of linear sweep voltammograms (LSV) of P1 and P2 copolymers deposited over FTO substrate at a scan rate of −2.45 mV/sec in a standard three electrode system under dark and simulated solar light (1 Sun).

The catalytic current as a function of potential was measured by LSV measurement, which was performed at a scan rate of 2.45 mV/sec under dark and light conditions. The SCE was calibrated against the reversible hydrogen potential (RHE) at room temperature. As illustrated in FIG. 7, negative voltage scanning from 0 to −1.2 V dramatically enhanced the HER. Under the illumination of solar light, the current density reached to a maximum value of −1.5 mA/cm$^2$ for both materials. The onset potential for these copolymers was observed at around −0.3 V, which was followed by a strong reduction dip in the voltammograms. The LSV results revealed a clear difference between current densities under dark and light conditions. In case of P2, the difference of current density at −1.2 V reached to a maximum value of 0.37 mA/cm$^2$, which indicated a ~25% current enhancement under illumination (FIG. 7).

Figure 8:
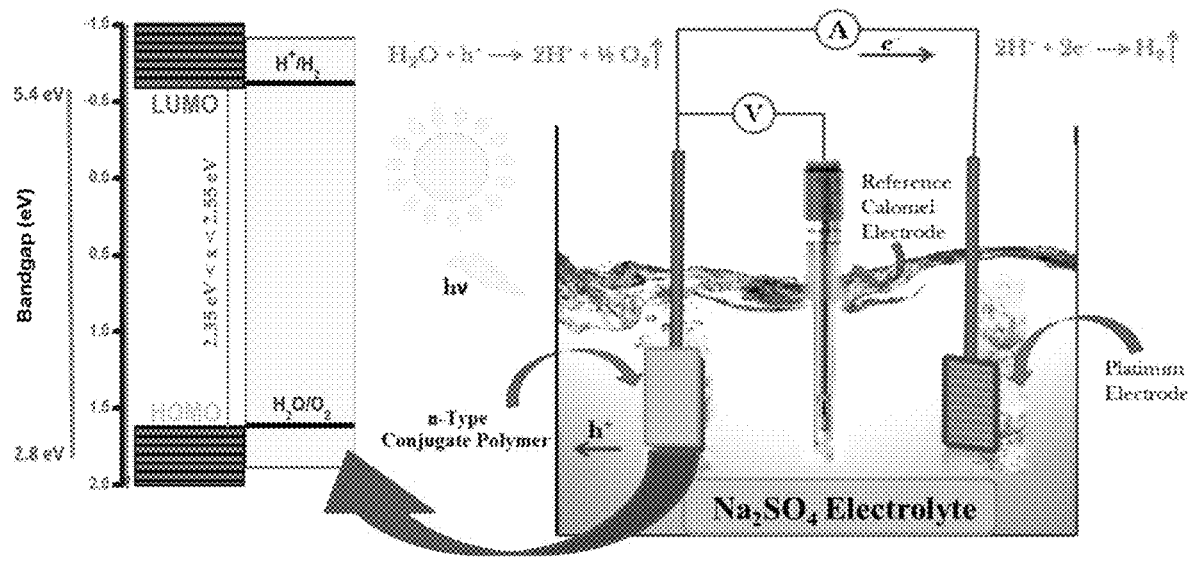
FIG. 8 depicts a proposed mechanism of water splitting.

The measured current densities during the water splitting at different potentials manifested that the reaction dominantly occurred at relatively higher positive voltages (FIGS. 16A-C and 17A-C). The HER occurred at LUMO levels of the copolymer, where H$^+$ accepted the available photogenerated negative charges and produce H$_2$ (FIG. 8). A previous study has revealed that for HER and OER (oxygen evolution reaction), ideal HOMO and LUMO levels should be at 4.44 and 5.67, respectively [Guiglion P, Butchosa C, Zwijnenburg M A. Polymer Photocatalysts for Water Splitting: Insights from Computational Modeling. Macromol Chem Phys 2016; 217:344-53, incorporated herein by reference in its entirety]. Thus, water splitting by P1 and P2 would require essential energy to adjust HOMO-LUMO levels, which is achieved through electromagnetic radiations and keeping the bias voltage at 0 V.

Example 8

Stability Testing

Figure 9:
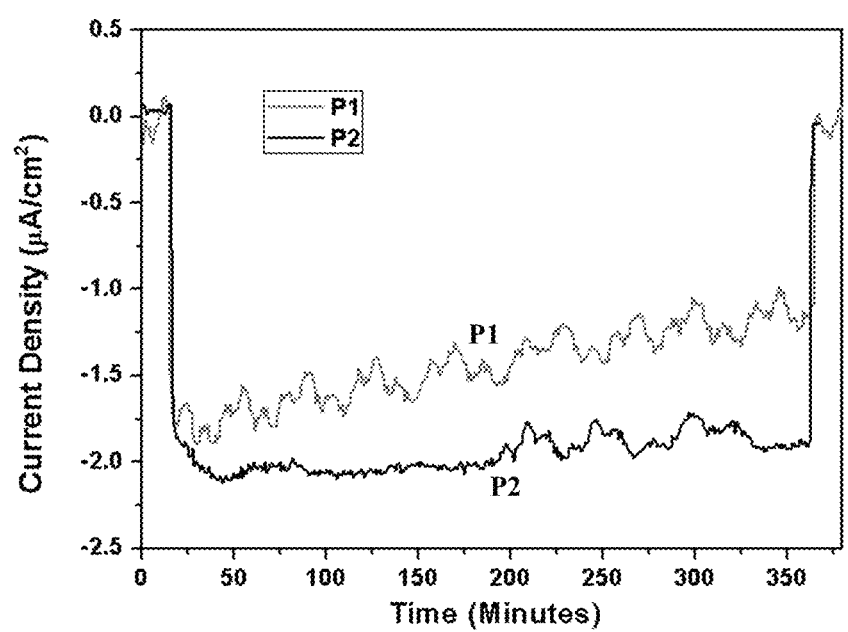
FIG. 9 shows stability testing of P1 and P2 copolymers deposited over FTO substrate by monitoring their current densities over a period of 360 min at an applied potential of 0 V vs. SCE bias in an aqueous solution of 0.5 M $Na_2SO_4$ at pH 7.

The long-term stability is vital for the performance and commercialization of a catalyst. Thus, the stability of copolymers P1 and P2 was tested via CA at 0 V bias vs SCE under illumination at pH 7.0 (FIG. 9). These results revealed that the current density of P2 was more stable than P1. After 360 minutes of time lapse, a decrease in the current density from 2.1 to 2.0 µA/cm$^2$ (3%) was observed for P2, whereas relatively higher decrease in the current density, from 1.18 to 1.12 µA/cm$^2$ (33%), was observed for P1. The higher stability of P2 could be associated with its larger surface area that would help minimize the charge recombination, as demonstrated by the drastic quenching of PL emission intensity of P2. Consequently, the higher charge recombination in P1 may be attributed to its significant photo-corrosion.

The invention claimed is:

1. A copolymer of formula (I)

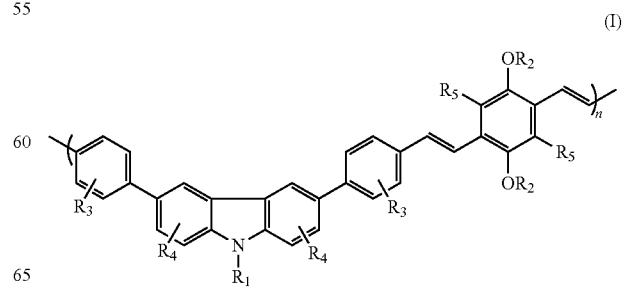

(I)

or a salt thereof, a solvate thereof, a tautomer thereof, a stereoisomer thereof, or a mixture thereof;
wherein:
R$_1$ is selected from the group consisting of a hydrogen, an optionally substituted alkyl, an optionally substituted cycloalkyl, an optionally substituted arylalkyl, an optionally substituted aryl, an optionally substituted alkanoyl, and an optionally substituted aroyl;
each R$_2$ is independently selected from the group consisting of an optionally substituted alkyl, an optionally substituted cycloalkyl, an optionally substituted aryl, and an optionally substituted arylalkyl;
each R$_3$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano;
each R$_4$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, and an optionally substituted aroyl;
each R$_5$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano; and
n is a positive integer in a range of 2-10,000.

2. The copolymer of claim 1,
wherein each R$_3$, R$_4$ and R$_5$ are a hydrogen;
R$_1$ is a hydrogen or an optionally substituted alkyl; and
each R$_2$ is independently an optionally substituted alkyl.

3. The copolymer of claim 2,
wherein R$_1$ is 2-ethylhexyl; and
each R$_2$ is independently 2-ethylhexyl or dodecyl.

4. The copolymer of claim 1, which has a formula selected from the group consisting of

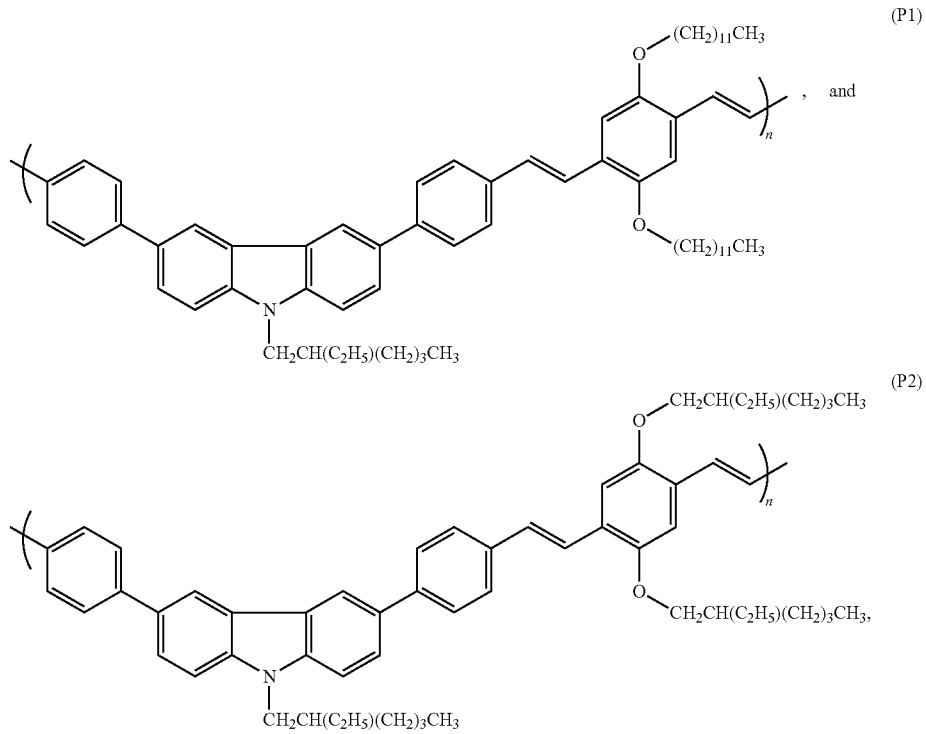

wherein n is a positive integer in the range of 2-10000 for each of formulae (P1) and (P2).

5. The copolymer of claim 1, which is in the form of microspheres having a diameter of 1-10 μm.

6. The copolymer of claim 1, which has a band gap energy of 2.0-2.8 eV.

7. The copolymer of claim 1, which has a fluorescence emission peak of 520-570 nm upon excitation at a wavelength of 380-400 nm.

8. A method of producing the copolymer of claim 1, the method comprising:
reacting a dialdehyde of formula (II)

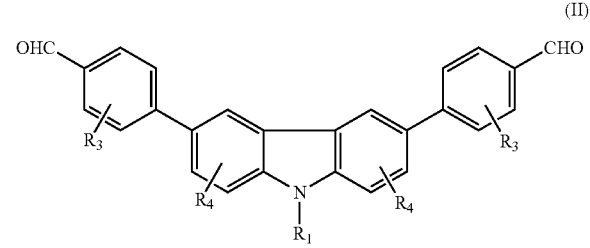

or a salt, solvate, tautomer or stereoisomer thereof, with a diphosphonate of formula

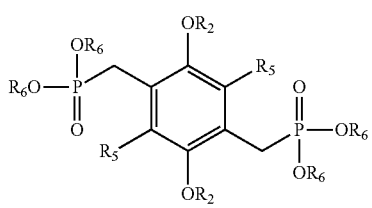
(III)

or a salt, solvate, tautomer or stereoisomer thereof in the presence of a base to form the copolymer, wherein:
$R_1$ is selected from the group consisting of a hydrogen, an optionally substituted alkyl, an optionally substituted cycloalkyl, an optionally substituted arylalkyl, an optionally substituted aryl, an optionally substituted alkanoyl, and an optionally substituted aroyl;
each $R_2$ is independently selected from the group consisting of an optionally substituted alkyl, an optionally substituted cycloalkyl, an optionally substituted aryl, and an optionally substituted arylalkyl;
each $R_3$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano;
each $R_4$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, and an optionally substituted aroyl;
each $R_5$ is independently selected from the group consisting of a hydrogen, an optionally substituted alkyl, an optionally substituted cycloalkyl, an optionally substituted arylalkyl, an optionally substituted aryl, an optionally substituted alkoxy, an optionally substituted alkanoyl, an optionally substituted aroyl, a halogen, a nitro, and a cyano; and
each $R_6$ is an optionally substituted alkyl or an optionally substituted arylalkyl.

9. The method of claim 8, wherein a molar ratio of the dialdehyde of formula (II) to the diphosphonate of formula (III) is in a range of 1:2 to 2:1.

10. A photoelectrode, comprising:
a metal oxide conducting substrate; and
a layer comprising the copolymer of formula (I) of claim 1 deposited over the metal oxide conducting substrate;
wherein the layer has a thickness in a range of 5-500 nm.

11. The photoelectrode of claim 10, which has an ultra-violet visible absorption with an absorption edge of 500-660 nm.

12. The photoelectrode of claim 10, wherein the metal oxide conducting substrate is fluorine doped tin oxide.

13. A photoelectrochemical cell, comprising:
the photoelectrode of claim 10;
a counter electrode; and
an electrolyte solution comprising water and an inorganic salt in contact with both electrodes.

14. The photoelectrochemical cell of claim 13, wherein the electrolyte solution has an inorganic salt concentration of 0.05-1 M.

15. The photoelectrochemical cell of claim 13, wherein the electrolyte solution has a pH in a range of 5-9.

16. The photoelectrochemical cell of claim 13, wherein the photoelectrode has a photo-current density in a range from −1.0 to −100 μA/cm² when the electrodes are subjected to a potential of −0.25 to 0.05 V under visible light irradiation.

17. The photoelectrochemical cell of claim 13, wherein the photoelectrode has a photo-current density in a range from −0.25 to −2.5 mA/cm² when the electrodes are subjected to a potential of −0.5 to −2.0 V under visible light irradiation.

18. The photoelectrochemical cell of claim 13, further comprising a reference electrode in contact with the electrolyte solution.

19. The photoelectrochemical cell of claim 16, wherein the photo-current density decreases by less than 35% after subjecting the photoelectrode to a potential of −0.25 to 0.05 V under visible light irradiation for 1-9 hours.

20. A method of forming hydrogen gas, the method comprising:
subjecting the electrodes of the photoelectrochemical cell of claim 13 to a potential of −2.0 to 0.05 V; and
concurrently irradiating the photoelectrochemical cell with visible light, thereby forming hydrogen gas.

* * * * *